(12) United States Patent
Sato

(10) Patent No.: US 7,238,995 B2
(45) Date of Patent: Jul. 3, 2007

(54) SEMICONDUCTOR DEVICE AND METHOD OF MANUFACTURING THE SAME

(75) Inventor: Yoko Sato, Suwa (JP)

(73) Assignee: Seiko Epson Corporation (JP)

( * ) Notice: Subject to any disclaimer, the term of this patent is extended or adjusted under 35 U.S.C. 154(b) by 161 days.

(21) Appl. No.: 10/789,352

(22) Filed: Feb. 26, 2004

(65) Prior Publication Data

US 2004/0195632 A1 Oct. 7, 2004

(30) Foreign Application Priority Data

Feb. 27, 2003 (JP) .............................. 2003-051118

(51) Int. Cl.
*H01L 29/76* (2006.01)
(52) U.S. Cl. .................. 257/392; 257/347; 257/353; 257/501
(58) Field of Classification Search ............... 257/347, 257/350, 501, 353, 391, 392, 500
See application file for complete search history.

(56) References Cited

U.S. PATENT DOCUMENTS 5,841,174 A * 11/1998 Arai ........................ 257/392
5,965,921 A * 10/1999 Kojima ..................... 257/369
6,404,026 B2 6/2002 Tsuyuki .................... 257/409
6,933,565 B2 * 8/2005 Matsumoto et al. ........ 257/347
2004/0079993 A1 * 4/2004 Ning et al. ................ 257/347

FOREIGN PATENT DOCUMENTS

| JP | 10-321716 | 12/1998 |
| JP | 2001-007219 | 1/2001 |
| JP | 2001-250921 | 9/2001 |
| JP | 2001-351995 | 12/2001 |

OTHER PUBLICATIONS

Japanese Office Action dated May 9, 2005.

* cited by examiner

*Primary Examiner*—N. Drew Richards
(74) *Attorney, Agent, or Firm*—John J. Penny, Jr.; George N. Chaclas; Edwards Angell Palmer & Dodge, LLP

(57) ABSTRACT

A semiconductor device comprising a high breakdown voltage transistor and a low breakdown voltage transistor. The semiconductor device comprises a support substrate, an insulating layer formed on the support substrate, a high breakdown voltage transistor, a low breakdown voltage transistor, wherein the high breakdown voltage transistor is adjacent to a first isolation region having a depth that reaches the insulating layer, and the low breakdown voltage transistor is adjacent to a second isolation region having a depth that does not reach the insulating layer.

12 Claims, 29 Drawing Sheets

SEMICONDUCTOR DEVICE AND METHOD OF MANUFACTURING THE SAME

Japanese Patent Application No. 2003-051118 filed on Feb. 27, 2003 is hereby incorporated by reference in its entirety.

BACKGROUND

1. Field of the Invention

The present invention relates to a semiconductor device equipped with MOS (Metal Oxide Semiconductor) transistors with different drain breakdown voltages that are provided on the same SOI (Silicon On Insulator) substrate.

2. Description of the Related Art

In recent years, mobile electronic appliances have been made smaller and lighter, making it essential to miniaturize ICs that are mounted in such electronic appliances. In particular, for an electronic appliance on which a liquid crystal display device is mounted, there are strong demands to reduce the chip area of a driver IC, which drives the liquid crystal display device, by mounting transistors with a low breakdown voltage for low voltage operations and transistors with a high breakdown voltage for high voltage operations on a same substrate (i.e., in the same chip).

However, to achieve a sufficiently high breakdown voltage, it is not possible to reduce the area of a transistor forming region for high breakdown voltage transistors. Accordingly, no matter how much low breakdown voltage transistors are miniaturized, it has not been possible to make large reductions in the chip area of a driver IC.

When high breakdown voltage transistors and low breakdown voltage transistors are formed on the same SOI substrate, it is necessary to change the structures of the transistors to make the transistors suitable for an SOI substrate so as to avoid the substrate floating effect and the like that are characteristic to SOI substrates. Therefore, it is not possible to apply design resources that have been produced for the case where transistors are formed on a bulk silicon substrate.

SUMMARY OF THE INVENTION

It is an object of the present invention to provide a semiconductor device equipped with a high breakdown voltage transistor and a low breakdown voltage transistor on the same substrate, and in particular to a semiconductor device which has a reduced area for a high breakdown voltage transistor region, which has a reduced overall size, and which eradicates characteristic effects, such as a substrate floating effect, of a SOI substrate in a low breakdown voltage transistor region, making it possible to apply conventional design resources, and a method of manufacturing such semiconductor device.

A semiconductor device according to the present invention comprises:

a support substrate;

an insulating layer formed on the support substrate;

a first semiconductor layer formed on the insulating layer;

a first high breakdown voltage transistor formed in the first semiconductor layer;

a second semiconductor layer formed on the insulating layer;

a second high breakdown voltage transistor formed in the second semiconductor layer;

a first isolation region that is provided between the first semiconductor layer and the second semiconductor layer and has a depth that reaches the insulating layer;

a third semiconductor layer formed on the insulating layer;

a first low breakdown voltage transistor provided in the third semiconductor layer;

a second low breakdown voltage transistor provided in the third semiconductor layer; and a second isolation region that is formed in the third semiconductor layer between the first low breakdown voltage transistor and the second first low breakdown voltage transistor and has a depth that does not reach the insulating layer.

According to the present invention, the high breakdown voltage transistor is formed in a region that is surrounded by, or adjacent to, the first isolation region with a depth that reaches the insulating layer. This means that a wide isolation region that was conventionally required to achieve the breakdown voltage is no longer needed. Since the isolation region reaches the insulating layer, the occurrence of parasitic transistors that would sometimes be formed in a lower part of the isolation region can also be inhibited. Additionally, since there is no need to provide a high concentration dispersed layer as a guard ring, the area of the high breakdown voltage transistor region can be reduced. The low breakdown voltage transistor is formed so as to be surrounded by, or adjacent to, the second isolation region with a depth that does not reach the insulating layer, so that problems such as the substrate floating effect produced when an SOI substrate is used can be eliminated. As a result, even in a case where high breakdown voltage transistors and low breakdown voltage transistors are formed on the same substrate, it is possible to miniaturize a semiconductor device. In addition, conventional design resources can be applied to the low breakdown voltage transistors.

A method of manufacturing a semiconductor device according to the present invention comprises:

a step of preparing a substrate where a support substrate, an insulating layer, and a semiconductor layer are formed in that order;

a step of forming a first semiconductor layer, a second semiconductor layer, and a third semiconductor layer by forming, in the semiconductor layer, a first isolation region and a third isolation region with a depth that reaches the insulating layer;

a step of forming a second isolation region in the third semiconductor layer with a depth that does not reach the insulating layer;

a step of forming a first high breakdown voltage transistor in the first semiconductor layer;

a step of forming a second high breakdown voltage transistor in the second semiconductor layer;

a step of forming a first low breakdown voltage transistor in the third semiconductor layer; and a step of forming a second low breakdown voltage transistor in the third semiconductor layer that is adjacent to the first low breakdown voltage transistor with the second isolation region in between.

According to the method of manufacturing a semiconductor device of the present invention, the high breakdown voltage transistor and the low breakdown voltage transistor are formed on semiconductor layers of the same thickness. The low breakdown voltage transistors are formed in regions surrounded by the second isolation region with a depth that does not reach the insulating layer, so that the characteristic effects of an SOI substrate, such as the substrate floating effect, are eradicated and conventional design resources can be applied. Also, since the high breakdown voltage transistors can be formed in semiconductor layers that are completely surrounded by the first isolation region, it is possible to manufacture a semiconductor device in which the occurrence of parasitic transistors, which would otherwise be formed in a lower part of the isolation region, is inhibited.

DESCRIPTION OF THE PREFERRED EMBODIMENTS

The present invention will now be described in detail with reference to preferred embodiments thereof.

Figure 1:
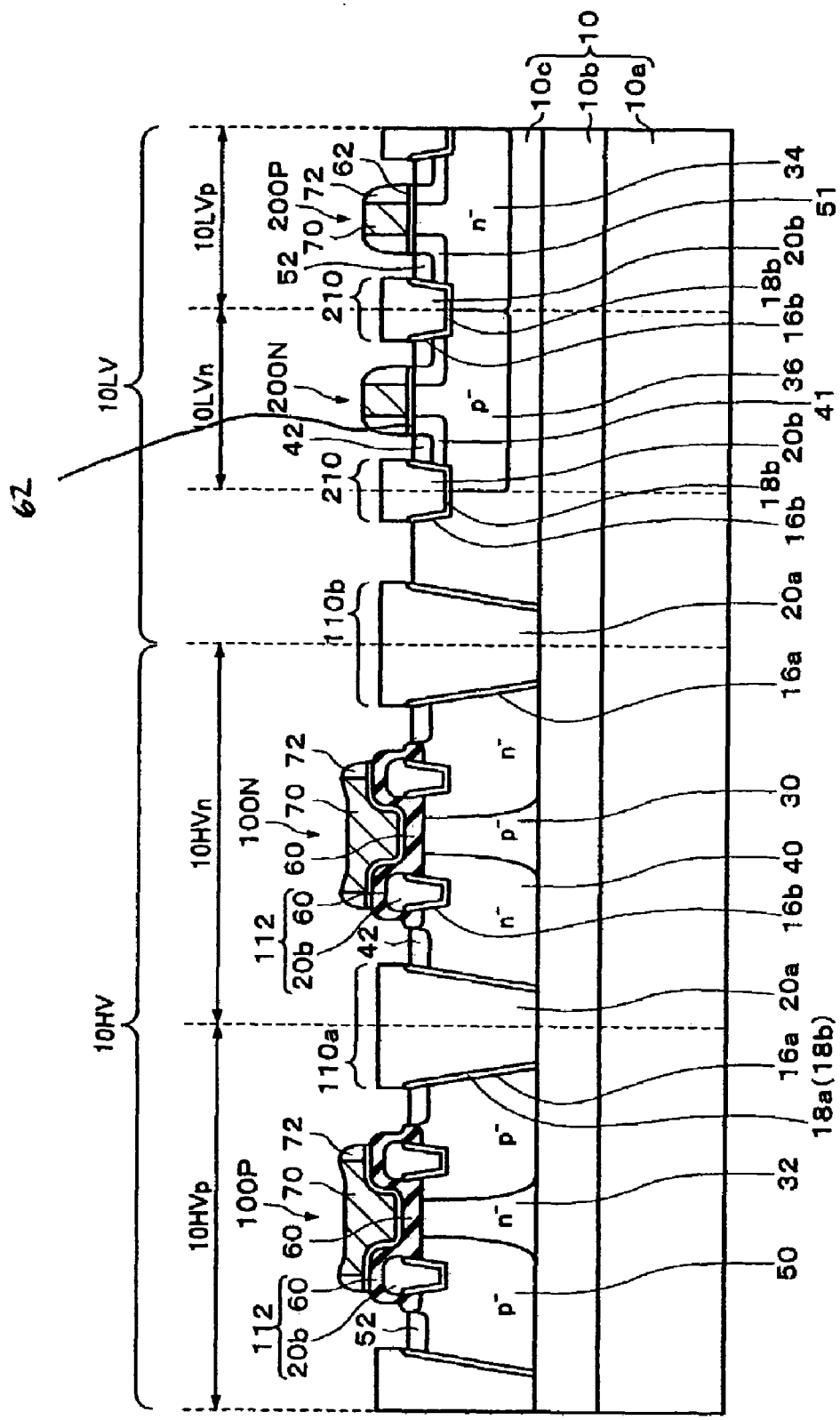
FIG. 1 is a cross-sectional view schematically showing a semiconductor device according to a present embodiment.

FIG. 1 is a cross-sectional view schematically showing a semiconductor device according to the present embodiment. The semiconductor device according to the present embodiment includes an SOI substrate 10 that has an insulating layer 10$b$ and a semiconductor layer 10$c$ formed in order as layers on a support substrate 10$a$. The semiconductor layer 10$c$ is a single-crystal silicon layer. A high breakdown voltage transistor region 10HV and a low breakdown voltage transistor region 10LV are provided in the SOI substrate 10. The high breakdown voltage transistor region 10HV includes a P channel high breakdown voltage transistor region 10HVp and an N channel high breakdown voltage transistor region 10HVn. The low breakdown voltage transistor region 10LV includes a P channel low breakdown voltage transistor region 10LVp and an N channel low breakdown voltage transistor region 10LVn. A P channel high breakdown voltage transistor 100P is formed in the P channel high breakdown voltage transistor region 10HVp, and an N channel high breakdown voltage transistor 100N is formed in the N channel high breakdown voltage transistor region 10HVn. In the same way, a P channel low breakdown voltage transistor 200P is formed in the P channel low breakdown voltage transistor region 10LVp, and an N channel low breakdown voltage transistor 200N is formed in the N channel low breakdown voltage transistor region 10LVn.

That is, the P channel high breakdown voltage transistor 100P, the N channel high breakdown voltage transistor 100N, the P channel low breakdown voltage transistor 200P, and the N channel low breakdown voltage transistor 200N are formed on the same substrate (i.e., in the same chip). It should be noted that although only four transistors are shown in FIG. 1, this is merely for convenience and it should be obvious that a plurality of each type of transistor are formed on the same substrate.

In the regions where each transistor is formed, the thickness of the semiconductor layer 10$c$ is equal. Accordingly, since the semiconductor layer 10$c$ is formed above the support substrate 10$a$ whose thickness is even and the insulating layer 10$b$ whose thickness is even, the surface of the semiconductor layer 10$c$ is at the same level in each transistor formation region.

First, the high breakdown voltage transistor region 10HV will be described. At the boundary between the high breakdown voltage transistor region 10HV and the low breakdown voltage transistor region 10LV, first and third isolation regions 110$a$, $b$ are formed with a depth that reaches the insulating layer 10$b$. That is, the third isolation region 10$b$ isolates the high breakdown voltage transistor region 10HV and the low breakdown voltage transistor region 10LV. As a result, the high breakdown voltage transistor region 10HV is surrounded by the third isolation region 110$b$ that is deep enough to reach the insulating layer 10$b$.

The P channel high breakdown voltage transistor region 10HVp and the N channel high breakdown voltage transistor region 10HVn are provided in the high breakdown voltage transistor region 10HV. Between the adjacent high breakdown voltage transistor regions, first and third isolation regions 110$a$, $b$ are provided with a depth that reaches the insulating layer 10$b$. That is, the first and third isolation regions 110a, b are provided between the adjacent P channel high breakdown voltage transistor 100P and the N channel high breakdown voltage transistor 100N with a depth that reaches the insulating layer 10b.

Next, the structures of the P channel high breakdown voltage transistor 100P and the N channel high breakdown voltage transistor 100N will be described.

The P channel high breakdown voltage transistor 100P includes a first gate insulating layer 60, a second gate insulating layer 112, a gate electrode 70, a P-type low concentration dopant layer 50, a sidewall insulating layer 72, and a P-type high concentration dopant layer 52.

The first gate insulating layer 60 is provided on an N-type well 32 that is a channel region. The second gate insulating layer 112 is provided above an offset region at both ends of the first gate insulating layer 60. It should be noted that as described later, the second gate insulating layer 112 is composed of a trench insulating layer 20b, that is an offset insulating layer, and the first gate insulating layer 60 formed as layered films. The gate electrode 70 is formed on at least the first gate insulating layer 60. The P-type low concentration dopant layer 50 is the offset region. The sidewall insulating layer 72 is formed on a side surface of the gate electrode 70. The P-type high concentration dopant layer 52 is provided outside the sidewall insulating layer 72. The P-type high concentration dopant layer 52 is a source region or a drain region (hereinafter, "source/drain region").

The N channel high breakdown voltage transistor 100N includes a first gate insulating layer 60, a second gate insulating layer 112, a gate electrode 70, an N-type low concentration dopant layer 40, a sidewall insulating layer 72, and an N-type high concentration dopant layer 42.

The first gate insulating layer 60 is provided on a P-type well 30 that is the channel region. The second gate insulating layer 112 is provided above an offset region at both ends of the first gate insulating layer 60. It should be noted that as described later, the second gate insulating layer 112 is composed of a trench insulating layer 20b and the first gate insulating layer 60 formed as layered films. The gate electrode 70 is formed on at least the first gate insulating layer 60. The N-type low concentration dopant layer 40 is the offset region. The sidewall insulating layer 72 is formed on a side surface of the gate electrode 70. The N-type high concentration dopant layer 42 is provided outside the sidewall insulating layer 72. The N-type high concentration dopant layer 42 is a source/drain region.

First, the low breakdown voltage transistor region 10LV will be described. The P channel low breakdown voltage transistor region 10LVp and the N channel low breakdown voltage transistor region 10LVn are provided in the low breakdown voltage transistor region 10LV. Second isolation regions 210 with a depth that does not reach the insulating layer 10b are provided between adjacent low breakdown voltage transistor regions. That is, the second isolation region 210 is provided between the P channel low breakdown voltage transistor 200P and the N channel low breakdown voltage transistor 200N with a depth that does not reach the insulating layer 10b.

Next, the structure of each transistor will be described.

The N channel low breakdown voltage transistor 200N includes a gate insulating layer 62, a gate electrode 70, a sidewall insulating layer 72, an N-type low concentration dopant layer 41, and an N-type high concentration dopant layer 42.

The gate insulating layer 62 is provided on a P-type well 36 that is a channel region. The gate electrode 70 is formed on the gate insulating layer 62. The sidewall insulating layer 72 is formed on a side surface of the gate electrode 70. The N-type low concentration dopant layer 41 is an offset region. The N-type high concentration dopant layer 42 is provided outside the sidewall insulating layer 72. The N-type high concentration dopant layer 42 is a source/drain region.

The P channel low breakdown voltage transistor 200P includes a gate insulating layer 62, a gate electrode 70, a sidewall insulating layer 72, a P-type low concentration dopant layer 51, and a P-type high concentration dopant layer 52.

The gate insulating layer 62 is provided on the N-type well 34 that is a channel region. The gate electrode 70 is formed on the gate insulating layer 62. The sidewall insulating layer 72 is formed on a side surface of the gate electrode 70. The P-type low concentration dopant layer 51 is an offset region. The P-type high concentration dopant layer 52 is formed outside the sidewall insulating layer 72. The P-type high concentration dopant layer 52 is a source/drain region.

The advantages of the semiconductor device according to the present invention are as follows.

In the semiconductor device according to the present embodiment, the high breakdown voltage transistor region 10HV is surrounded by the third isolation region 110b with a depth that reaches the insulating layer 10b. The first and third isolation regions 110a, b are formed between adjacent high breakdown voltage transistor regions with a depth that reaches the insulating layer 10b. That is, completely isolated semiconductor layers 10c can be formed for the high breakdown voltage transistors 100P and 100N. This means that it is possible to inhibit the formation of a parasitic MOS transistor that would conventionally be formed in a lower part of an isolation region. It also becomes unnecessary to provide a guard ring composed of a high concentration dispersed layer, and the area of the high breakdown voltage transistor region can be reduced.

In the semiconductor device according to the present embodiment, second isolation regions 210 with a depth that does not reach the insulating layer 10b are provided between adjacent low breakdown voltage transistor regions. Accordingly, the low breakdown voltage transistors have approximately the same operation as bulk-type MOS transistors, characteristic effects of SOI substrates, such as the substrate floating effect, can be eradicated, and conventional design resources can be applied.

Next, a first method of manufacturing a semiconductor device will be described with reference to FIGS. 2 to 20. FIGS. 2 to 20 are cross-sectional views schematically showing steps in a first method of manufacturing the semiconductor device.

Figure 2:
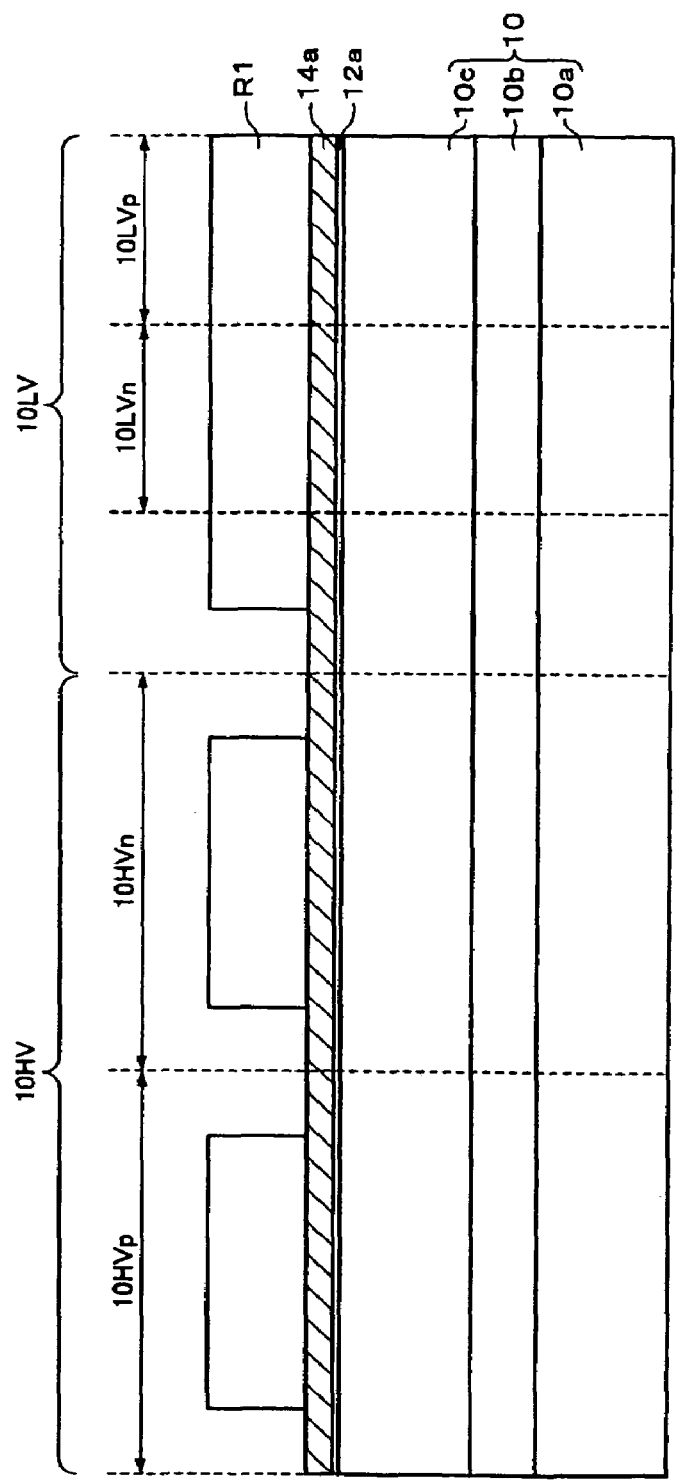
FIG. 2 is a cross-sectional view showing a step in a first method of manufacturing a semiconductor device.

(1) As shown in FIG. 2, the semiconductor device according to the present embodiment is formed of an SOI substrate 10 where an insulating layer 10b and a semiconductor layer 10c are formed in layers on a support substrate 10a. A single-crystal silicon layer can be used as the semiconductor layer 10c. The thickness of the semiconductor layer 10c should preferably be 500 to 2000 nm. As shown in FIG. 2, a first insulating layer 12a is formed on the semiconductor layer 10c. A silicon oxide layer, a silicon-oxynitride (SiON) layer, or the like is used as the first insulating layer 12a. The first insulating layer 12a can be formed by a method such as CVD.

Next, a stopper insulating layer 14a is formed on the first insulating layer 12a. The stopper insulating layer 14a can be formed of a silicon nitride film. The stopper insulating layer 14a can be formed by a method such as CVD. A resist layer R1 with a predetermined pattern is formed on the stopper insulating layer 14a. The resist layer R1 has openings in regions where the first and third isolation regions 110a, b are formed.

Figure 3:
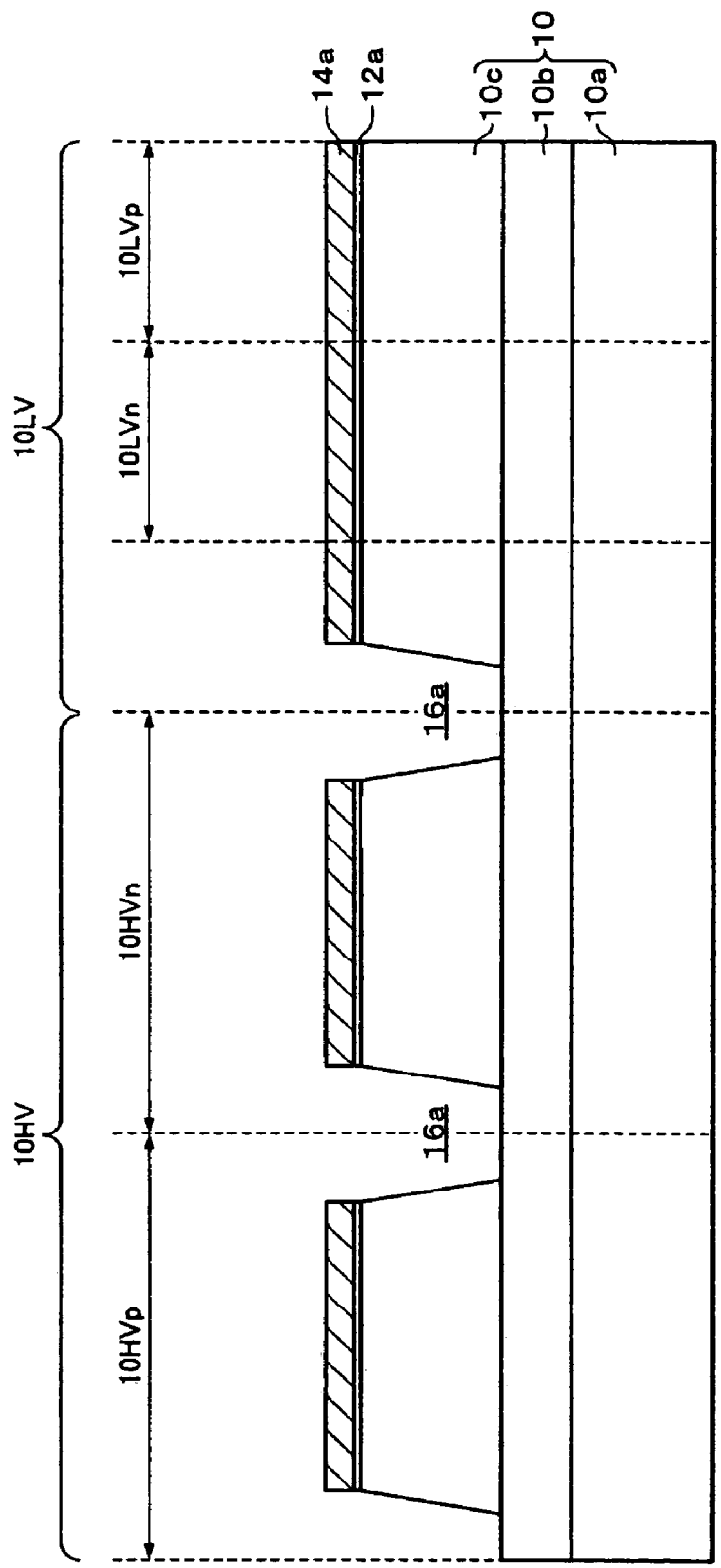
FIG. 3 is a cross-sectional view showing a step in the first method of manufacturing a semiconductor device.

(2) Next, as shown in FIG. 3, the stopper insulating layer 14a and the first insulating layer 12a are etched using the resist layer R1 (see FIG. 2) as a mask. After this, the semiconductor layer 10c is etched with the resist layer R1, the stopper insulating layer 14a, and the first insulating layer 12a as a mask to form trenches 16a. When the trenches 16a are formed, base parts of the trenches 16a are formed so as to reach the insulating layer 10b. The etching of the semiconductor layer 10c can be performed by dry etching, for example.

Figure 4:
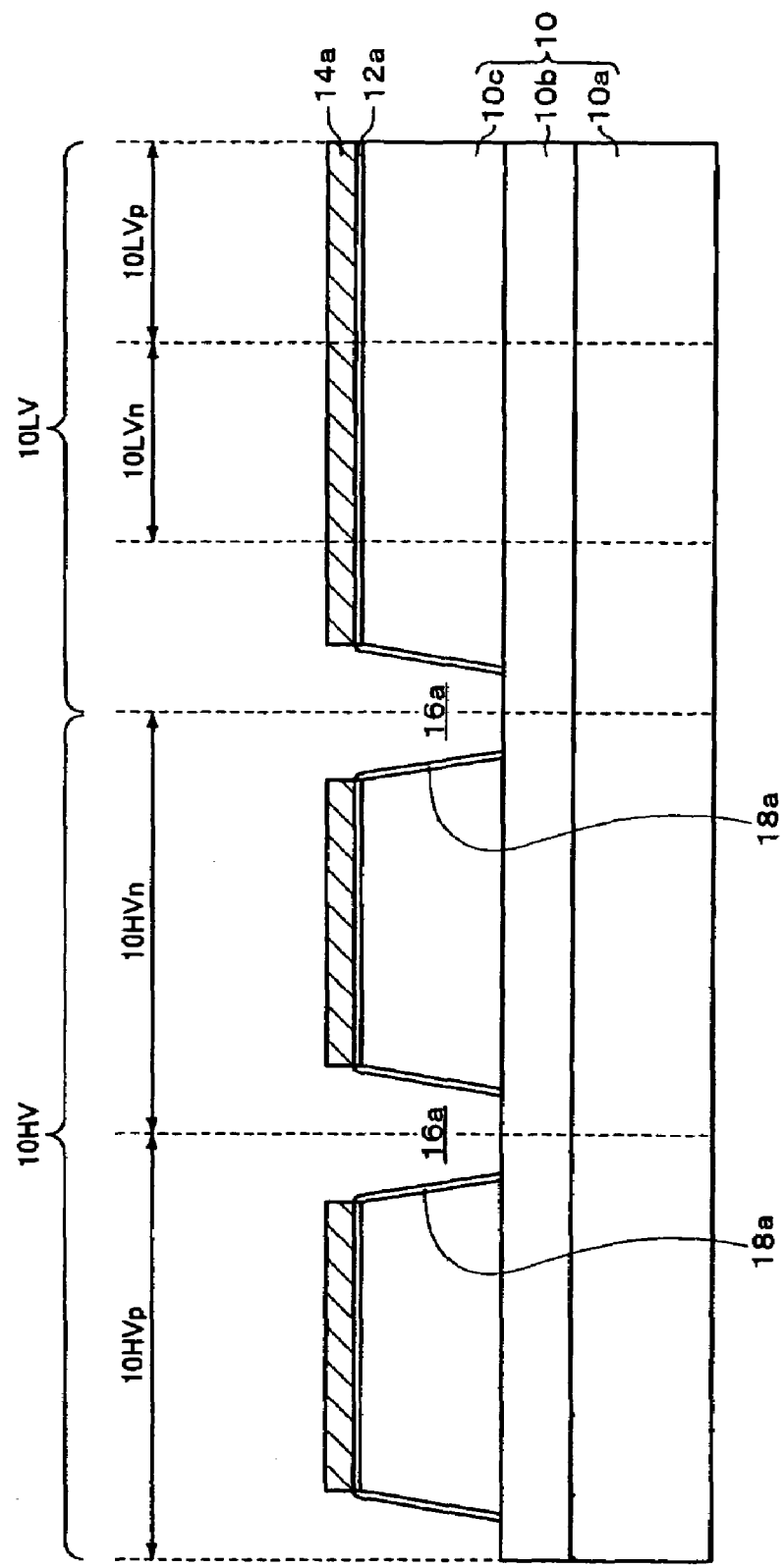
FIG. 4 is a cross-sectional view showing a step in the first method of manufacturing a semiconductor device.

(3) Next, as shown in FIG. 4, trench oxide films 18a are formed on surfaces of the trenches 16a. These trench oxide films 18a can be formed by thermal oxidation, for example. The thickness of the trench oxide films 18a is 50 to 500 nm, for example.

Before the trench oxide films 18a are formed, it is possible to etch end parts of the first insulating layer 12a as necessary. By doing so, during the formation of the trench oxide films 18a, it is possible to form the trench oxide films 18a so as to be rounded at the upper end parts of the trenches 16a. If the trench oxide films 18a are formed so as to be rounded at the upper end parts of the trenches 16a, no stepped parts are produced, therefore it becomes possible to favorably bury a trench insulating layer in a later step.

Figure 5:
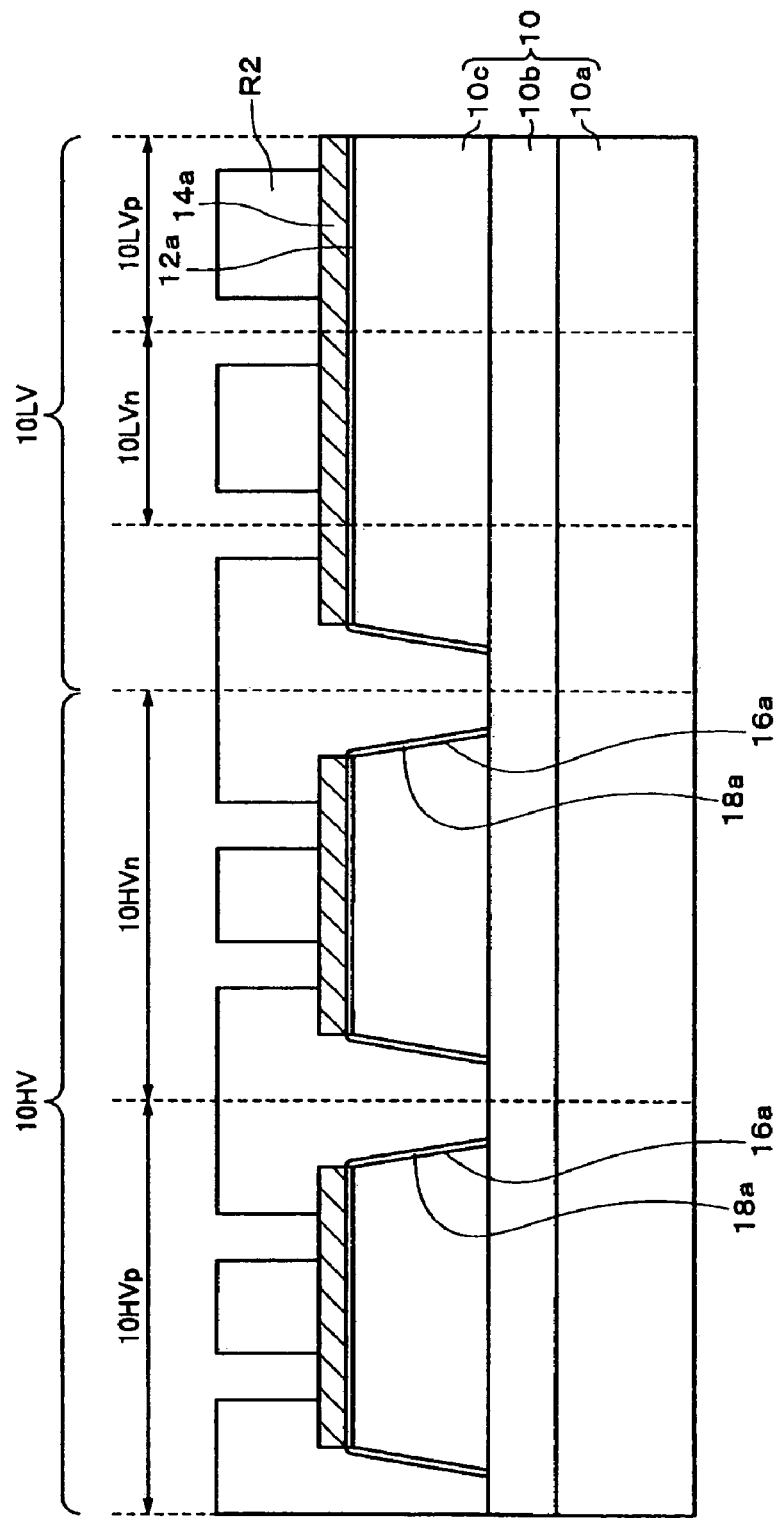
FIG. 5 is a cross-sectional view showing a step in the first method of manufacturing a semiconductor device.

(4) Next, as shown in FIG. 5, a resist layer R2 with a predetermined pattern is formed. This resist layer R2 has openings above a region of the high breakdown voltage transistor region 10HV in which the second gate insulating layer 112 is formed and openings above regions of the low breakdown voltage transistor region 10LV in which the second isolation regions 210 are formed.

Figure 6:
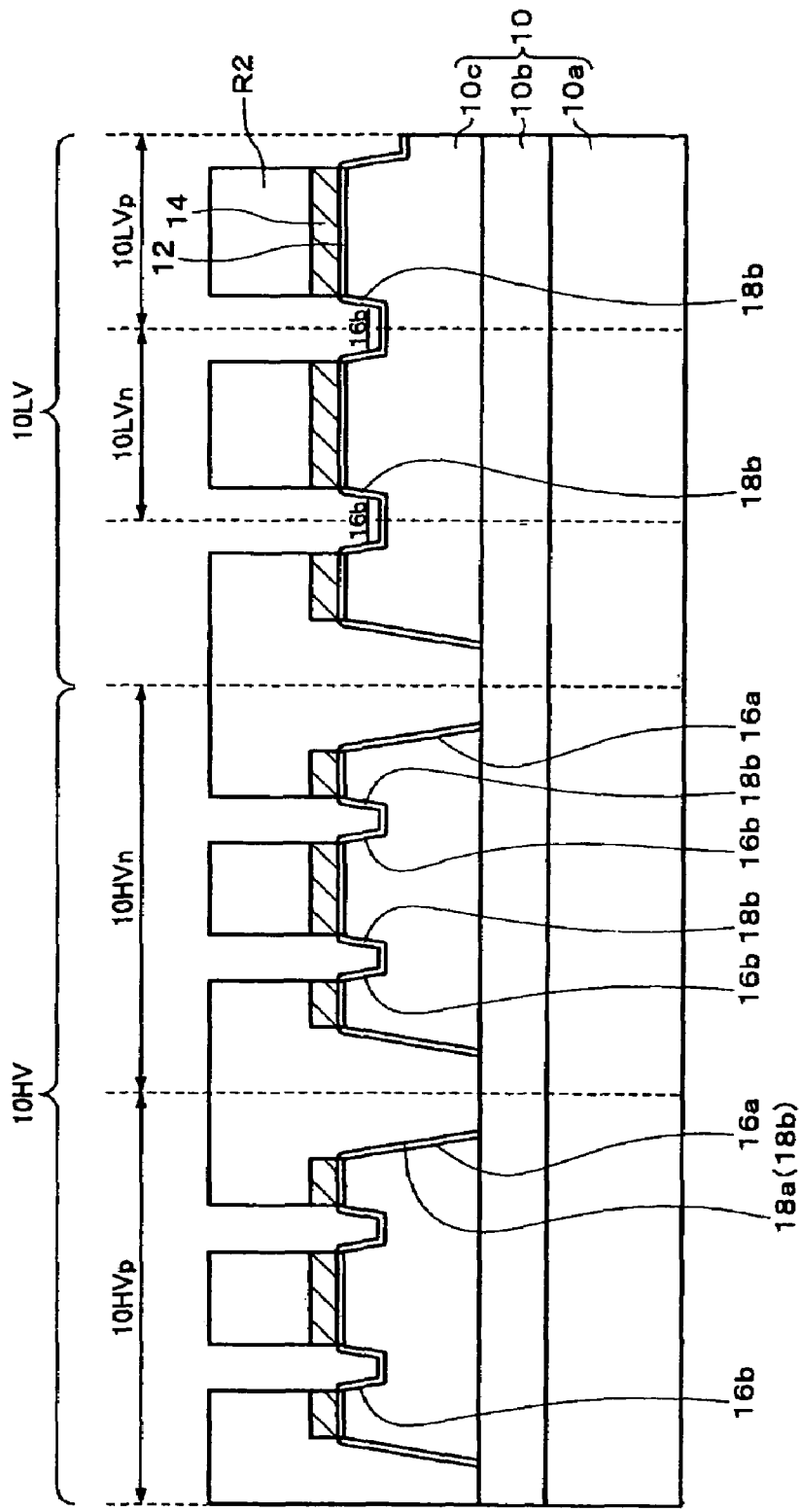
FIG. 6 is a cross-sectional view showing a step in the first method of manufacturing a semiconductor device.

(5) Next, as shown in FIG. 6, the first insulating layer 12a and the stopper insulating layer 14a are etched with the resist layer R2 as a mask. Next, the semiconductor layer 10c is etched with at least the resist layer R2 as a mask. Trenches 16b are formed in the semiconductor layer 10c by this etching. When the trenches 16b are formed, base parts of the trenches 16b are formed so as to not reach the insulating layer 10b. The depth of the trenches 16b can be set at around 400 nm, for example. As a result of the patterning by steps (2) to (5), the first insulating layer 12a becomes a pad layer 12, and the stopper insulating layer 14a becomes a stopper layer 14. After this, the resist layer R2 is removed by ashing.

Figure 7:
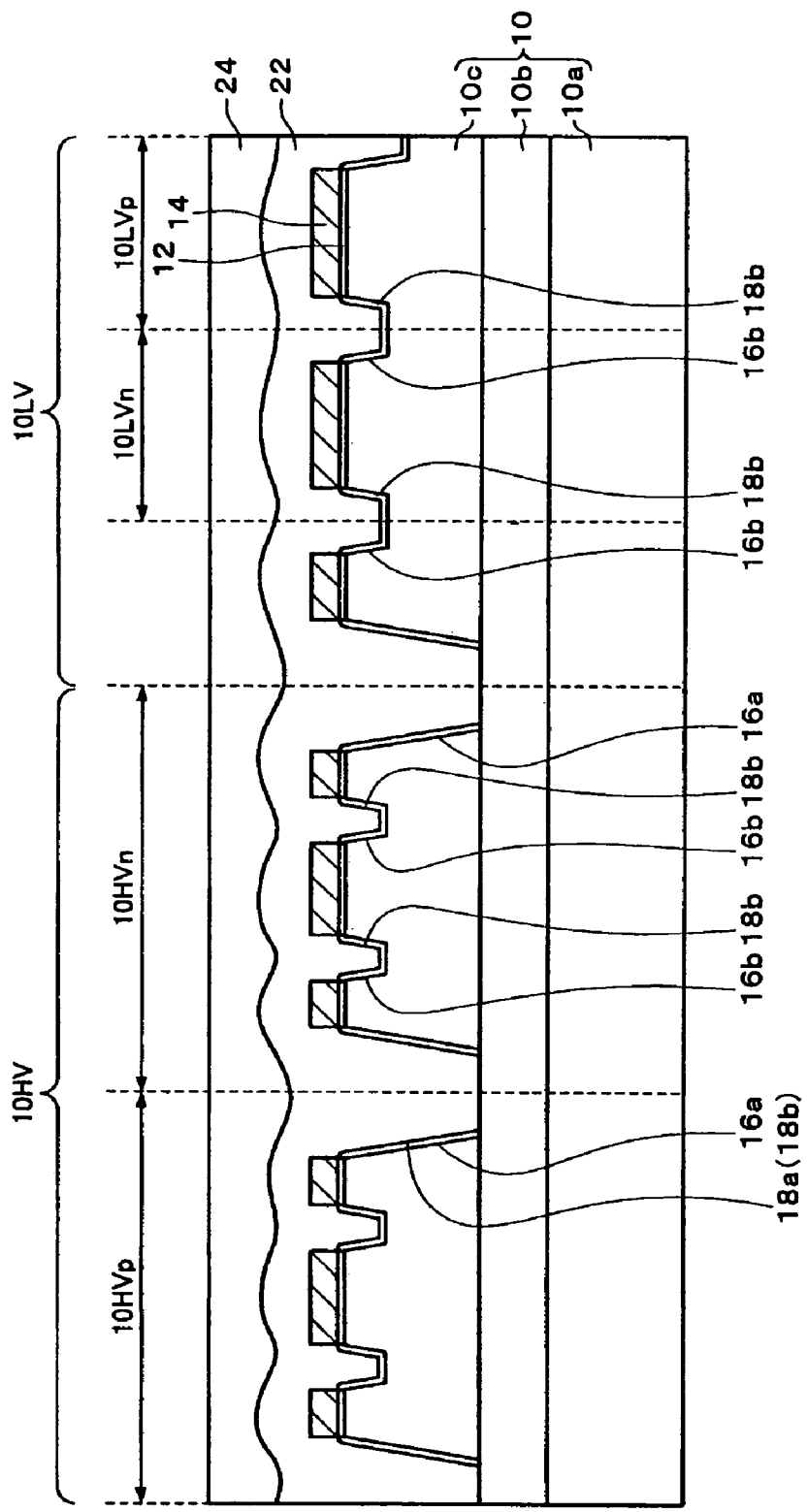
FIG. 7 is a cross-sectional view showing a step in the first method of manufacturing a semiconductor device.

(6) Next, as shown in FIG. 7, trench oxide layers 18b are formed on surfaces of the trenches 16b. The trench oxide layers 18b can be formed by thermal oxidation, for example. When doing so, the trench oxide layers 18b may be formed on the trench oxide films 18a in the trenches 16a. Alternatively, the trench oxide layers 18b may be formed after the trench oxide films 18a have been removed.

Next, an insulating layer 22 is formed so as to bury the trenches 16a and the trenches 16b. The insulating layer 22 may be thick enough to bury the trenches 16a, 16b and to cover the stopper layer 14. Next, as shown in FIG. 7, an SOG film 24 is applied onto the insulating layer 22 so as to form a flat surface.

Figure 8:
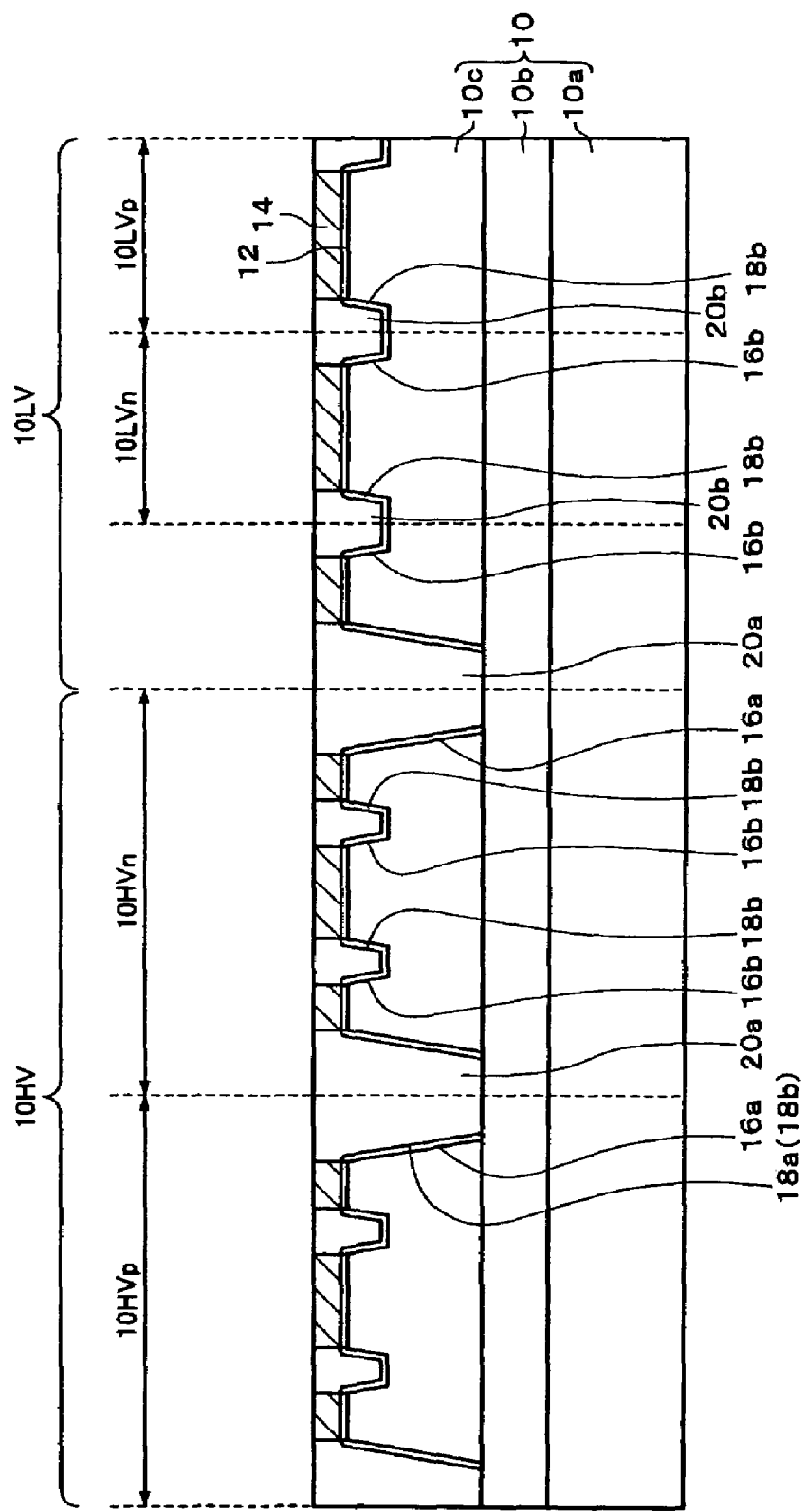
FIG. 8 is a cross-sectional view showing a step in the first method of manufacturing a semiconductor device.

(7) Next, as shown in FIG. 8, the SOG film 24 and the insulating layer 22 are removed until an upper surface of the stopper layer 14 is exposed. The SOG film 24 and the insulating layer 22 are removed using a method such as CMP. By doing so, trench insulating layers 20a, 20b are formed in the trenches 16a, 16b. As a result, the first and third isolation regions 110a, b and the second isolation regions 210 are formed. Also, in this step, offset insulating layers that are part of the second gate insulating layer 112 are formed in the high breakdown voltage transistor region 10HV. It should be noted that in the present embodiment, since the offset insulating layers are formed by a method where element are isolated by trenches, the offset insulating layers are called the trench insulating layers 20b.

Figure 9:
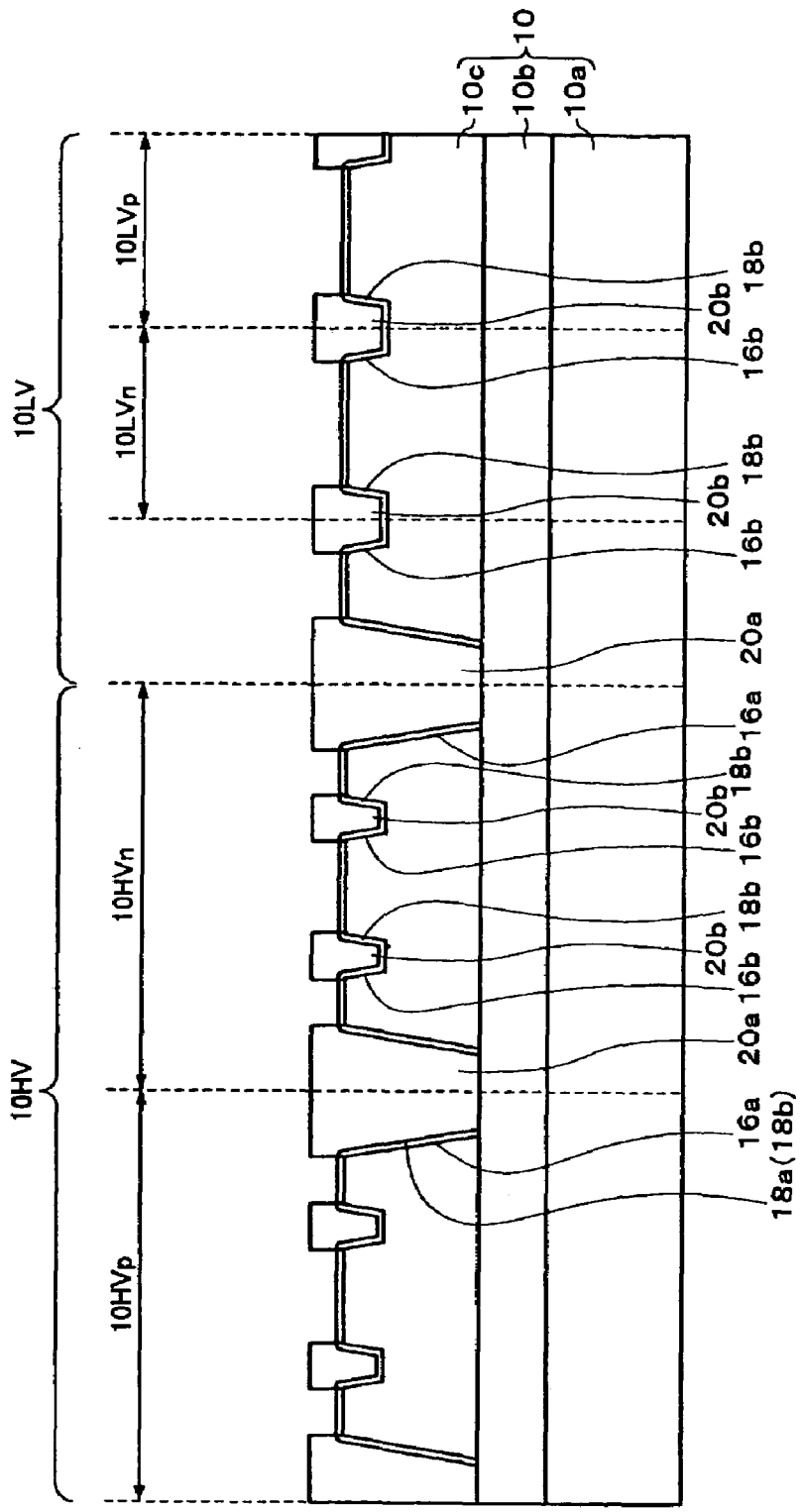
FIG. 9 is a cross-sectional view showing a step in the first method of manufacturing a semiconductor device.

(8) Next, as shown in FIG. 9, the stopper layer 14 is removed. The removal of the stopper layer 14 can be performed by wet etching using hot phosphoric acid, for example. Next, a sacrificial oxide film (not shown) is formed on an upper surface of the semiconductor substrate 10. A silicon oxide film, for example, can be formed as the sacrificial oxide film. In this case, the sacrificial oxide film can be formed by thermal oxidation.

Figure 10:
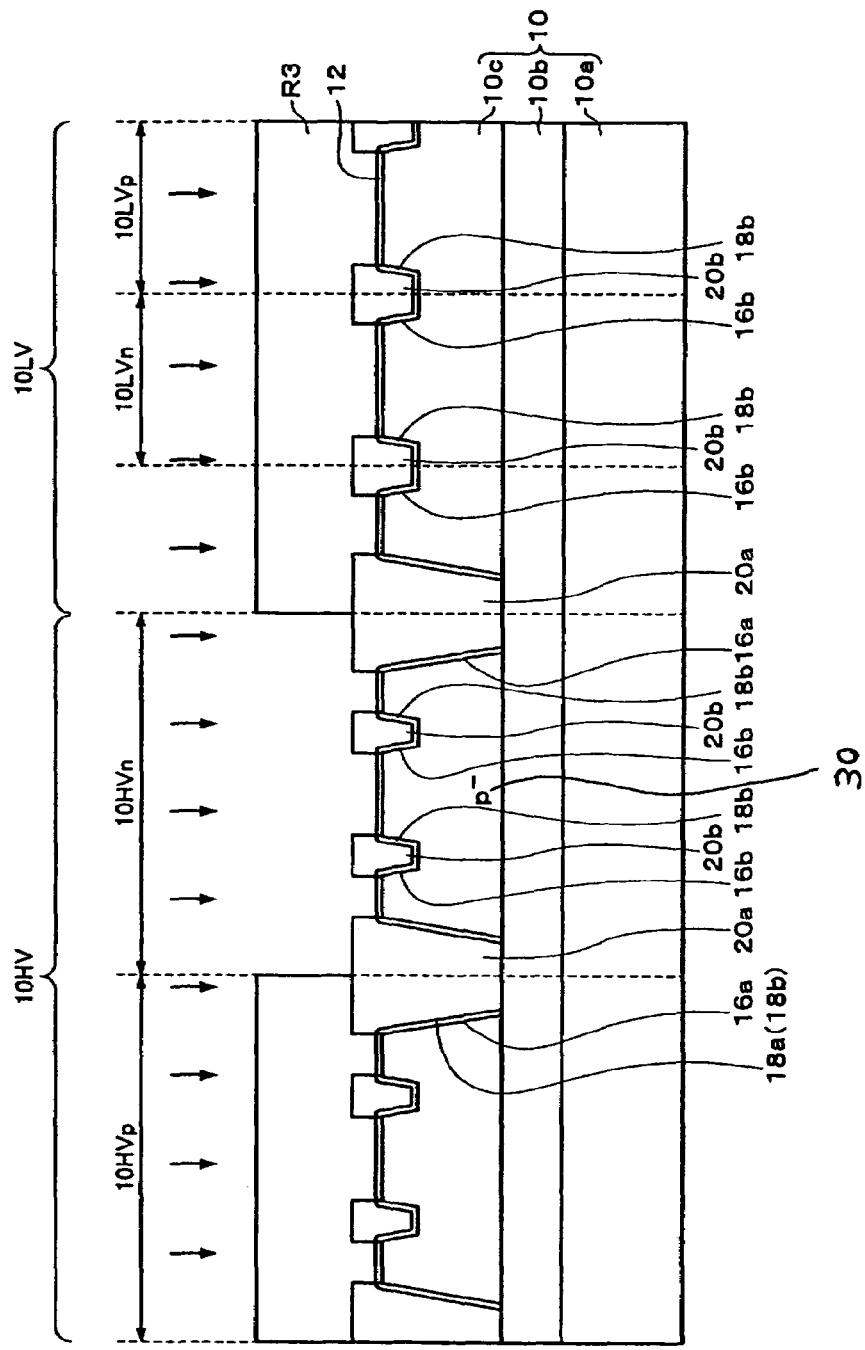
FIG. 10 is a cross-sectional view showing a step in the first method of manufacturing a semiconductor device.
Figure 11:
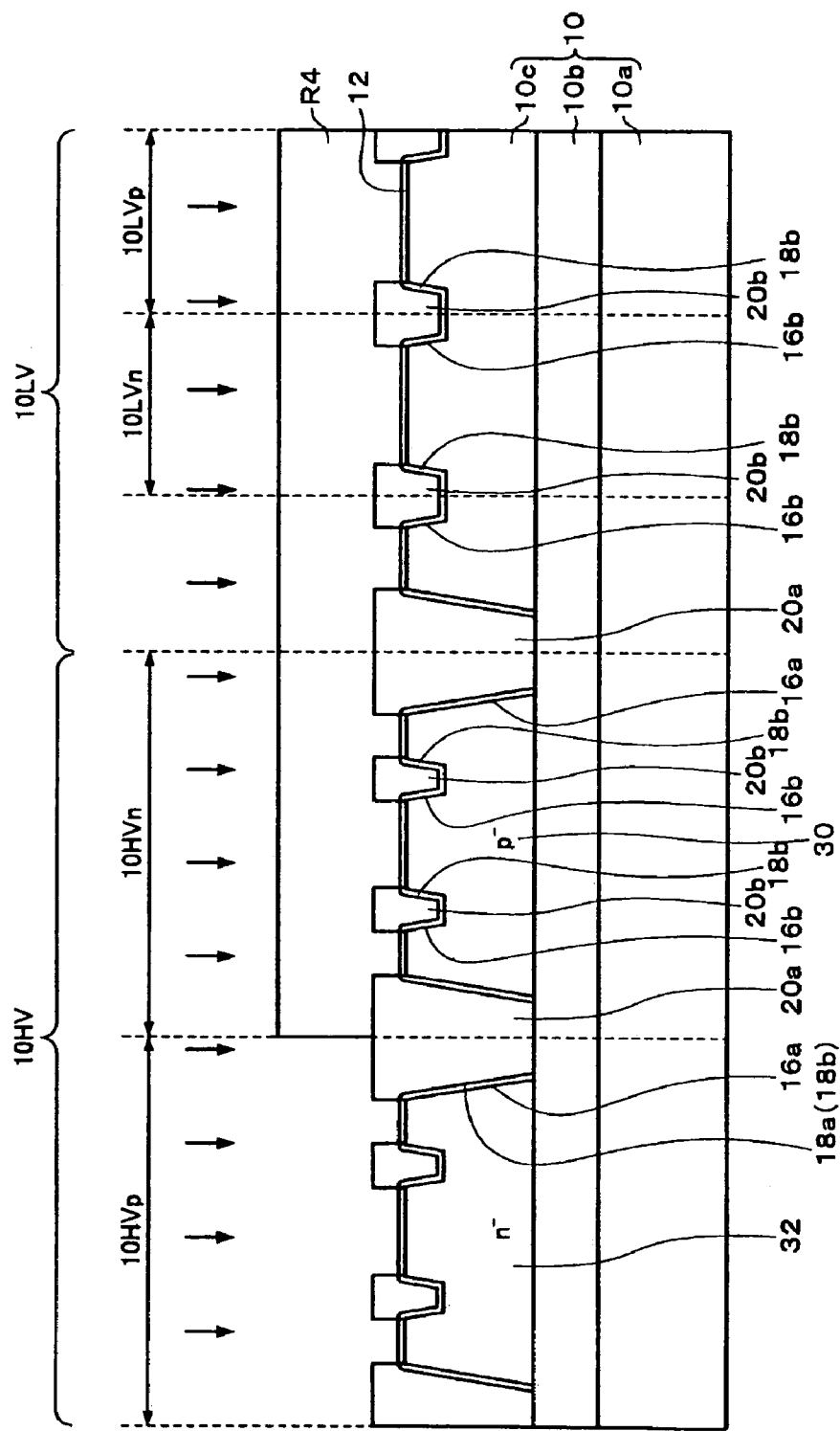
FIG. 11 is a cross-sectional view showing a step in the first method of manufacturing a semiconductor device.

(9) Next, as shown in FIG. 10, a P-type well 30 is formed in the high breakdown voltage transistor region 10HV. More specifically, a resist layer R3 with a predetermined pattern is formed, and the P-type well 30 is formed by introducing P-type dopant ions into the semiconductor layer 10c with the resist layer R3 as a mask. After this, the resist layer R3 is removed by ashing.

(10) Next, as shown in FIG. 1, the N-type well 32 is formed in the high breakdown voltage transistor region 10HV. First, a resist layer R4 with a predetermined pattern is formed. The N-type well 32 is formed by introducing N-type dopant, such as phosphorus or arsenic, into the semiconductor layer 10c once or a plurality of times with the resist layer R4 as a mask. After this, the resist layer R4 is removed by ashing. It should be noted that the steps (9) and (10) may be performed in reverse order to that given in the present embodiment.

Figure 12:
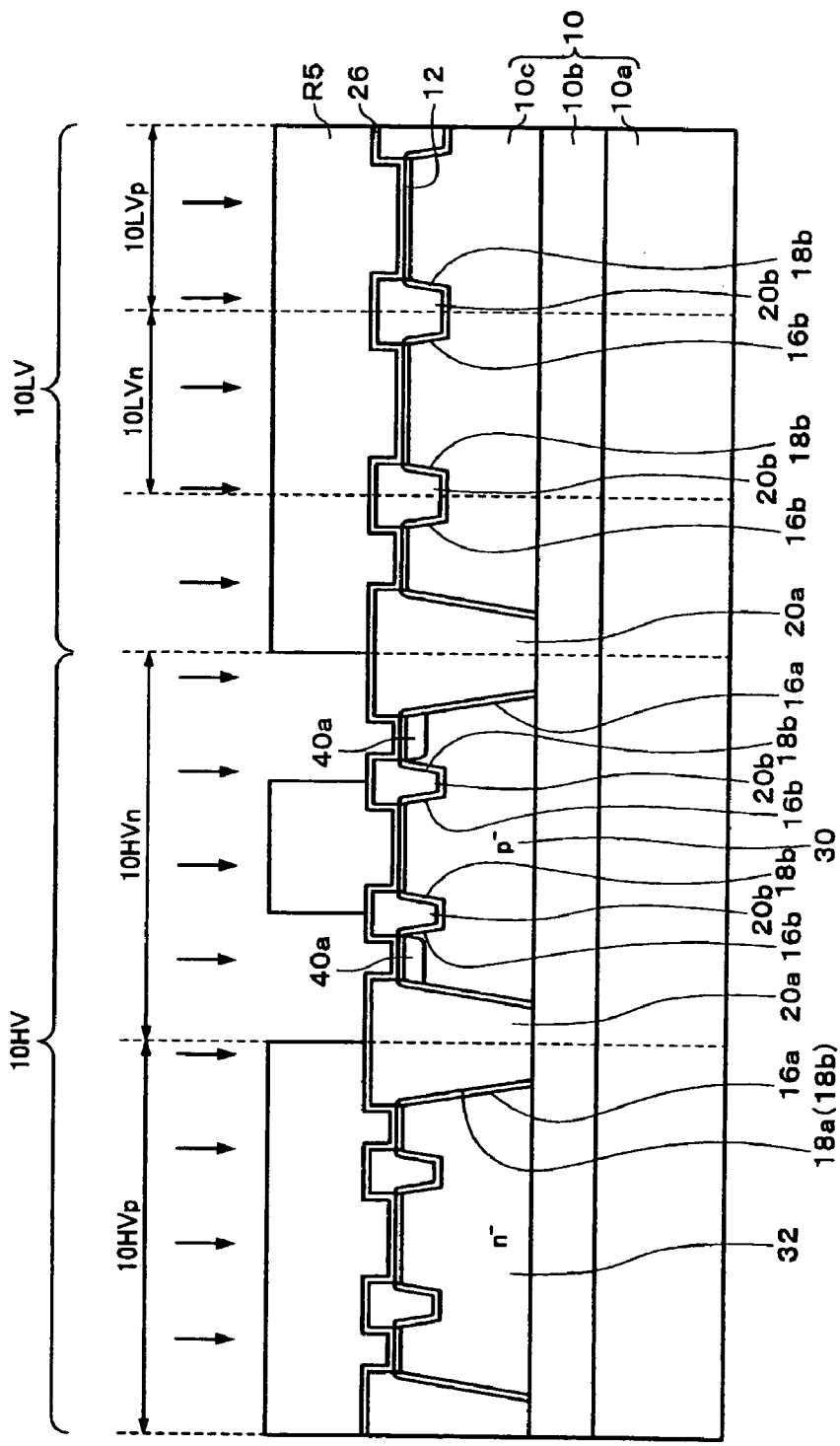
FIG. 12 is a cross-sectional view showing a step in the first method of manufacturing a semiconductor device.

(11) Next, as shown in FIG. 12, a silicon nitride layer 26 is formed on the entire surface of the high breakdown voltage transistor region 10HV and the low breakdown voltage transistor region 10LV.

Next, dopant layers for offset regions of the source/drain regions are formed in the high breakdown voltage transistor region 10HV.

First, a resist layer R5 that covers predetermined regions is formed. Dopant layers 40a are formed by introducing a P-type dopant into the semiconductor layer 10c with the resist layer R5 as a mask. After this, the resist layer R5 is removed by ashing.

Figure 13:
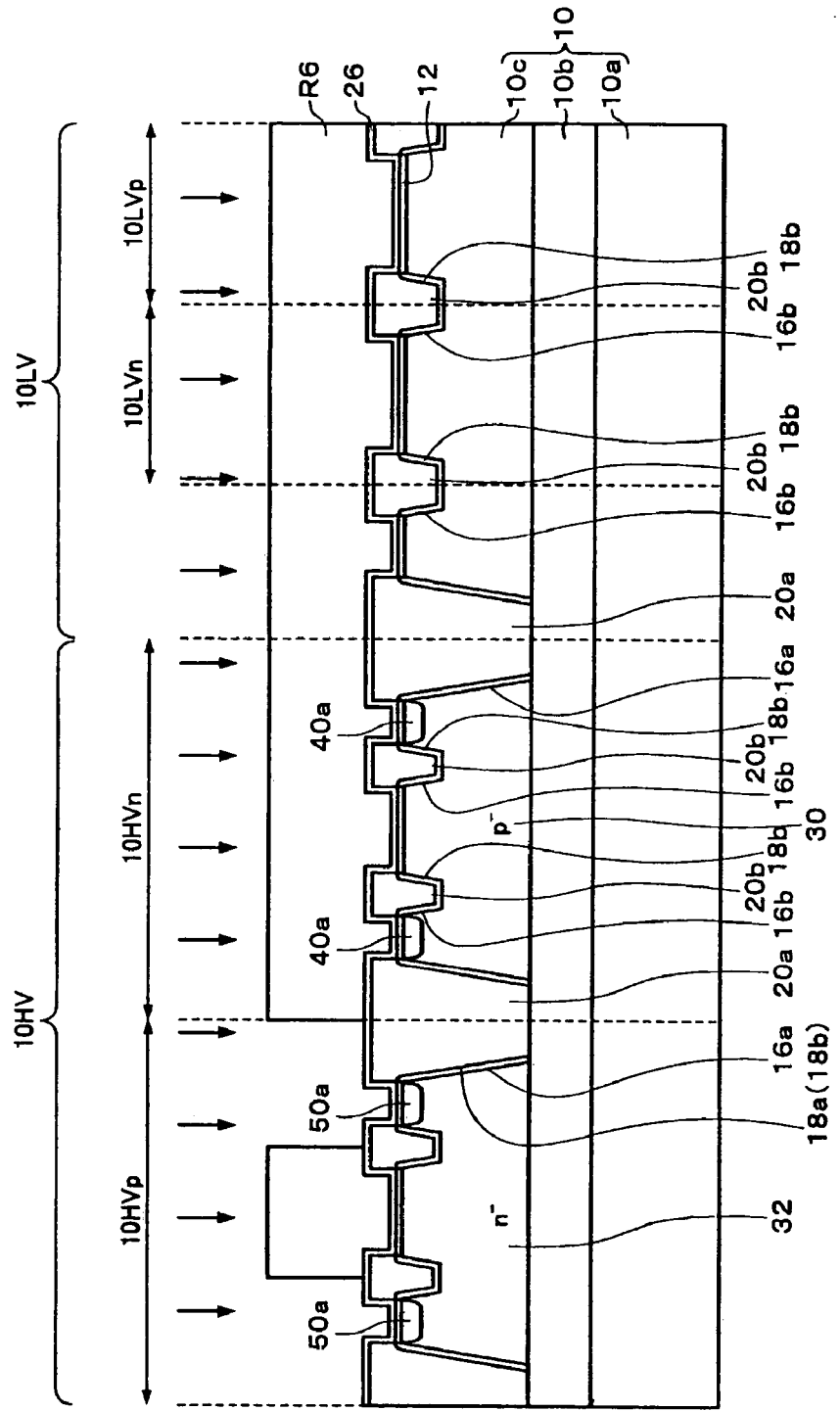
FIG. 13 is a cross-sectional view showing a step in the first method of manufacturing a semiconductor device.

(12) Next, as shown in FIG. 13, a resist layer R6 that covers predetermined regions is formed. A P-type dopant is then introduced into the semiconductor layer 10c with the resist layer R6 as a mask. By doing so, dopant layers 50a for offset regions of the source/drain region are formed in the P channel high breakdown voltage transistor region 10HVp.

Figure 14:
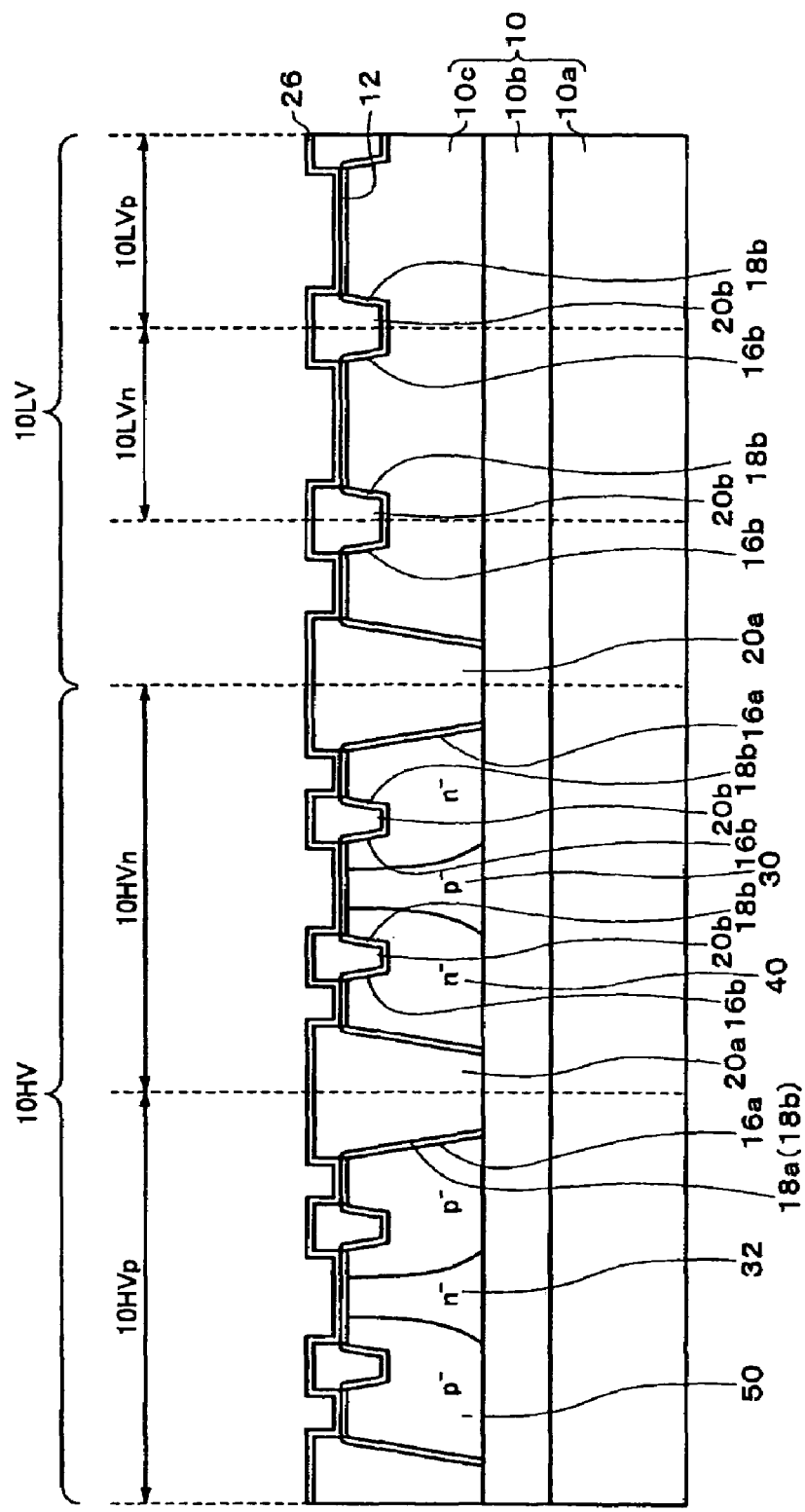
FIG. 14 is a cross-sectional view showing a step in the first method of manufacturing a semiconductor device.

(13) Next, as shown in FIG. 14, the dopant layers 40a, 50a are dispersed by carrying out a heat treatment, thereby forming the low concentration dopant layers 40, 50 that are the offset regions of the high breakdown voltage transistors 100P, N.

Figure 15:
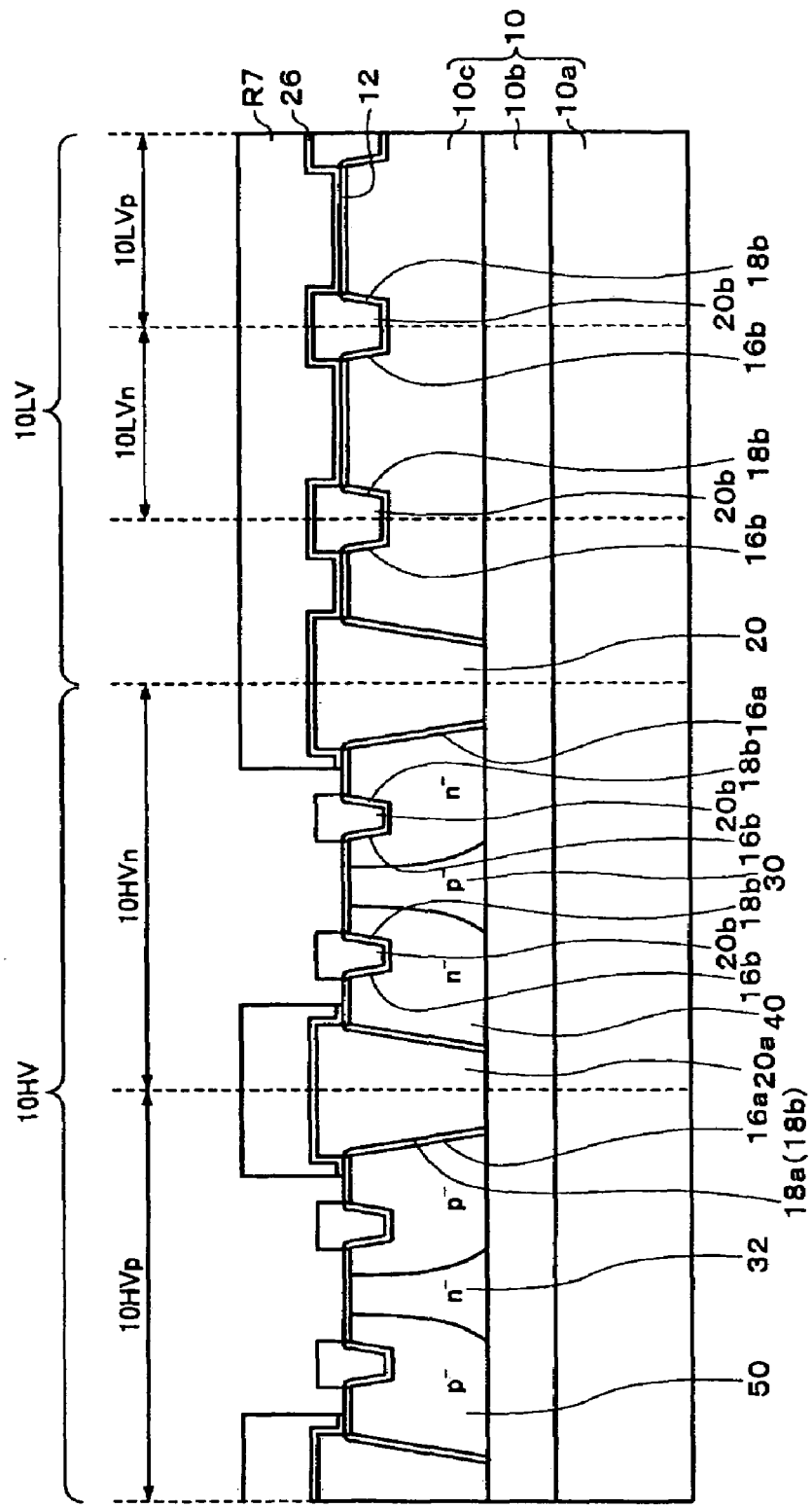
FIG. 15 is a cross-sectional view showing a step in the first method of manufacturing a semiconductor device.

(14) Next, as shown in FIG. 15, a resist layer R7 is formed so as to cover parts of the high breakdown voltage transistor region 10HV aside from the regions in which the gate insulating layers of the respective transistors are formed.

The exposed silicon nitride layer 26 is then removed with the resist R7 as a mask. Next, channel doping is performed as necessary in the high breakdown voltage transistor region 10HV. The channel doping can be performed by the following method, for example. First a resist layer (not shown) is formed so as to cover the areas aside from the P-channel high breakdown voltage transistor region 10HVp. A P-type dopant, for example boron or the like, is then introduced with the resist layer as a mask. After this, the resist layer is removed by ashing. Next, a resist layer (not shown) is formed so as to cover the areas aside from the N-channel high breakdown voltage transistor region 10HVn. An N-type dopant, for example phosphorus or the like, is then introduced with the resist layer as a mask. After this, the resist layer is removed by ashing.

Figure 16:
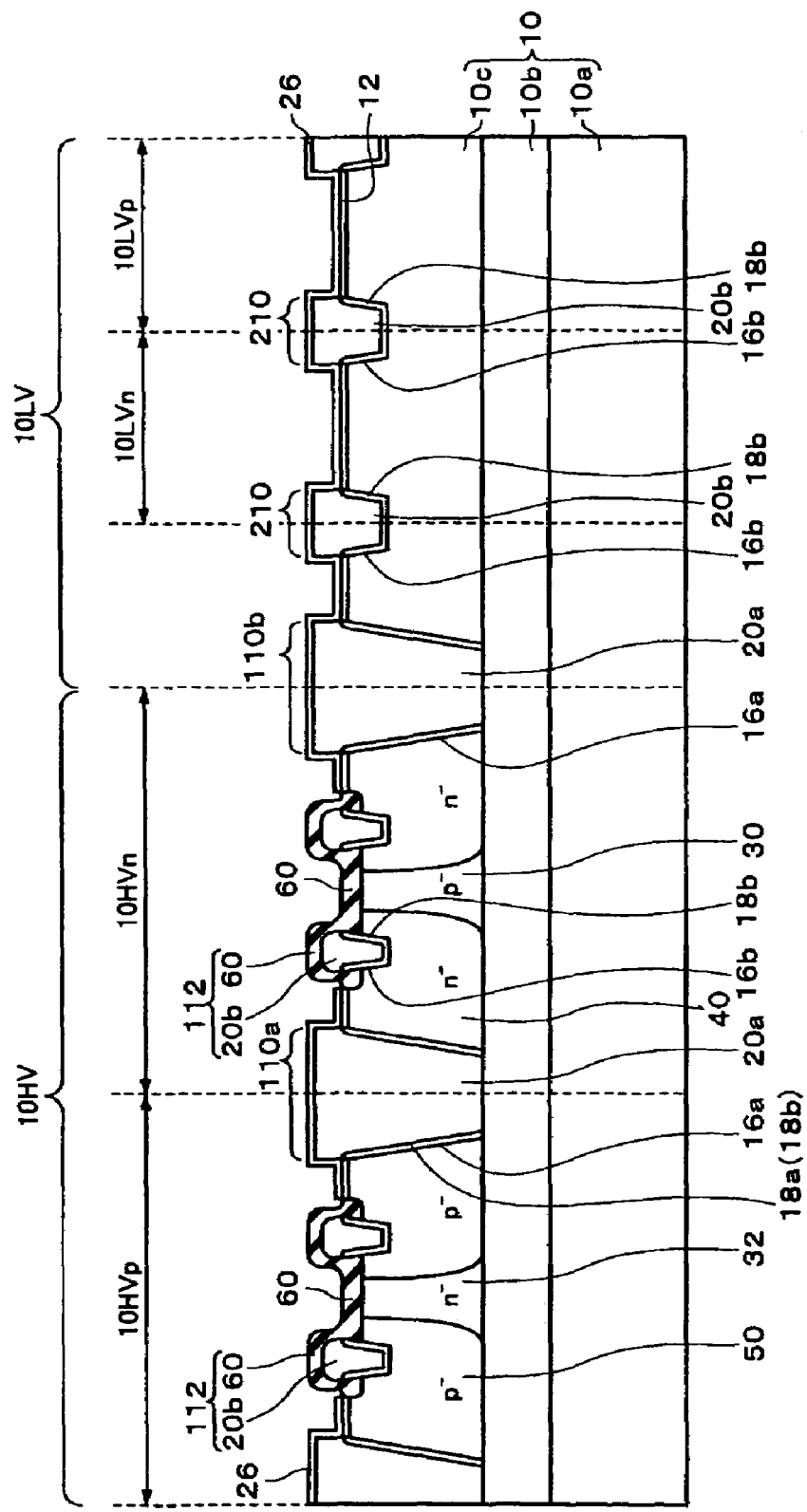
FIG. 16 is a cross-sectional view showing a step in the first method of manufacturing a semiconductor device.

(15) Next, as shown in FIG. 16, the first gate insulating layers 60 are formed in the high breakdown voltage transistor region 10HV. The first gate insulating layers 60 can be formed by selective thermal oxidation. The thickness of the first gate insulating layer 60 is around 1,600 Å. Next, the remaining silicon nitride layer 26 is removed.

Figure 17:
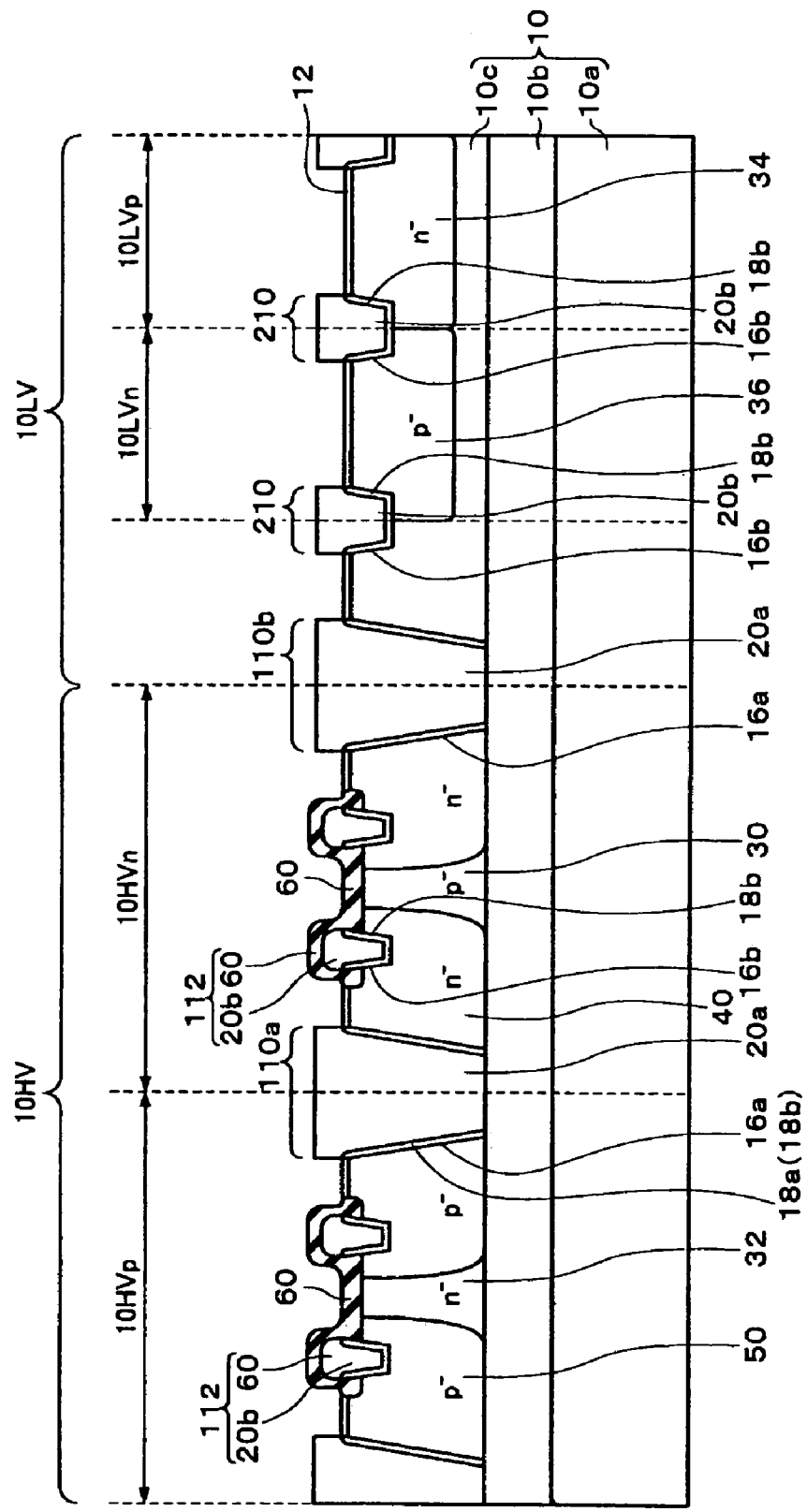
FIG. 17 is a cross-sectional view showing a step in the first method of manufacturing a semiconductor device.

(16) Next, as shown in FIG. 17, the N-type well 34 and the P-type well 36 are formed in the low breakdown voltage transistor region 10LV. More specifically, the N-type well 34 and the P-type well are formed by forming a mask layer of a predetermined pattern using a standard lithographic technique and introducing dopants of predetermined conductivity types. Next, channel doping may be performed as necessary.

Figure 18:
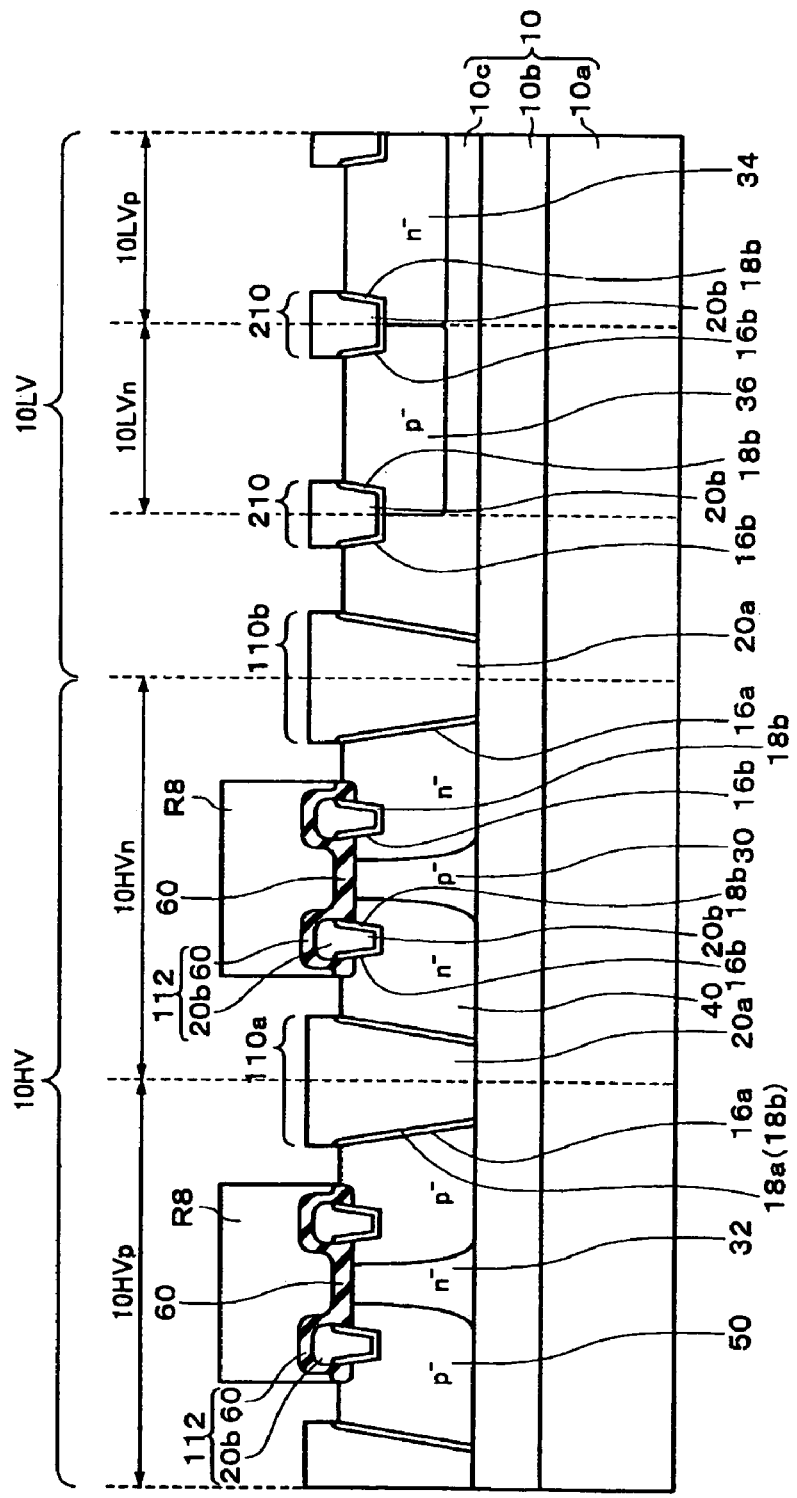
FIG. 18 is a cross-sectional view showing a step in the first method of manufacturing a semiconductor device.

(17) Next, as shown in FIG. 18, a resist layer R8 is formed so as to cover the region where the first gate insulating layers 60 are formed in the high breakdown voltage transistor region 10HV, and the exposed pad layer 12 is removed. This etching of the pad layer 12 can be performed by wet etching using fluoric acid, for example.

Figure 19:
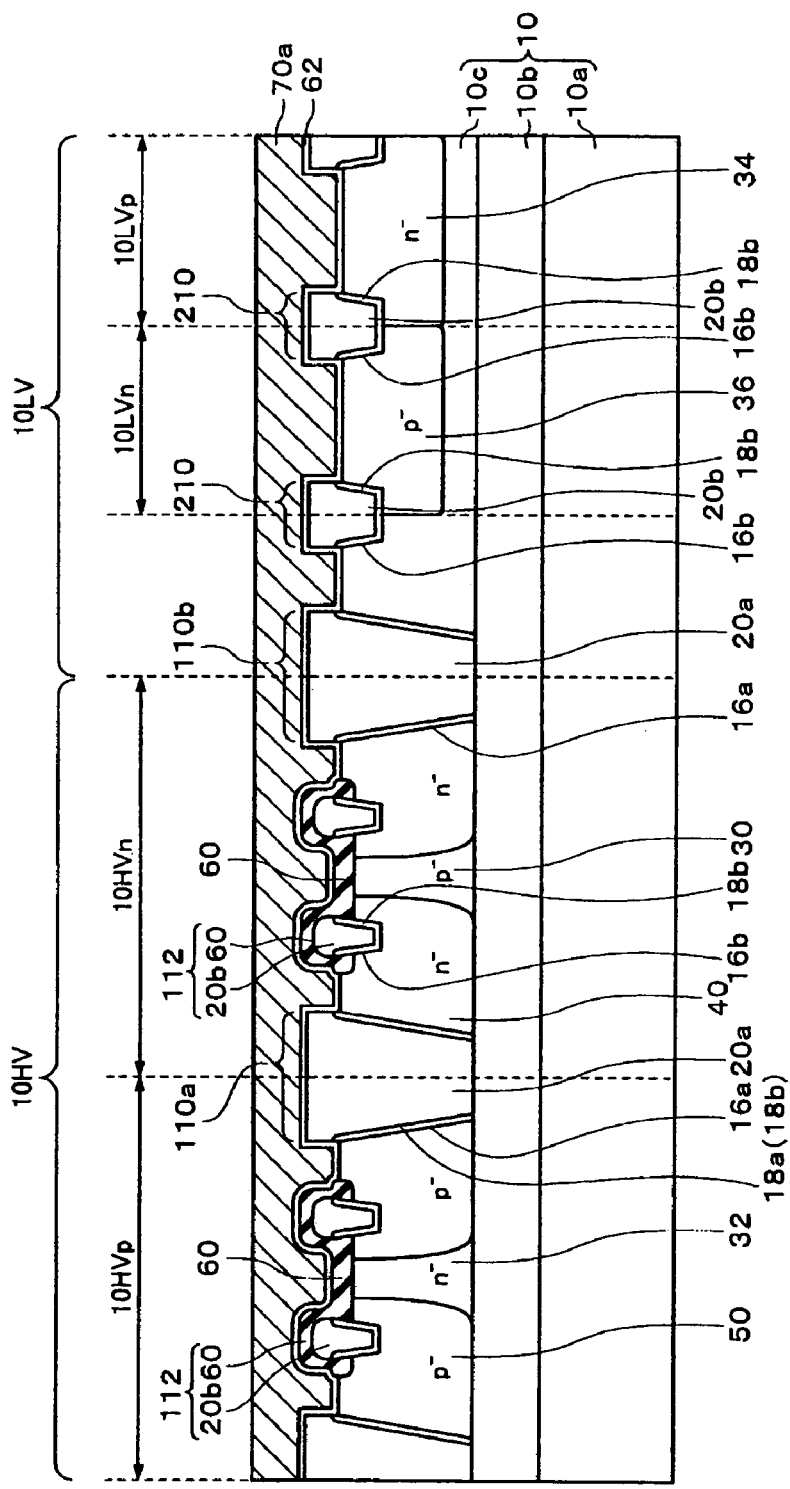
FIG. 19 is a cross-sectional view showing a step in the first method of manufacturing a semiconductor device.

(18) Next, as shown in FIG. 19, the gate insulating layer 62 for the low breakdown voltage transistors is formed. The gate insulating layer 62 is formed by thermal oxidation. The thickness of the gate insulating layer 62 is 45 Å, for example. The gate insulating layer 62 is also formed in the high breakdown voltage transistor region 10HV.

Next, as shown in FIG. 19, a conductive layer 70a is formed on the entire surface of the high breakdown voltage transistor region 10HV and the low breakdown voltage transistor region 10LV. A polysilicon layer, for example, is formed as the conductive layer 70a. When a polysilicon layer is formed as the material of the conductive layer 70a, n-type dopant is introduced into regions that become the gate electrodes of the N channel high breakdown voltage transistor 100N and the N channel low breakdown voltage transistor 200N (see FIG. 1), thereby lowering the resistance of the gate electrodes.

Figure 20:
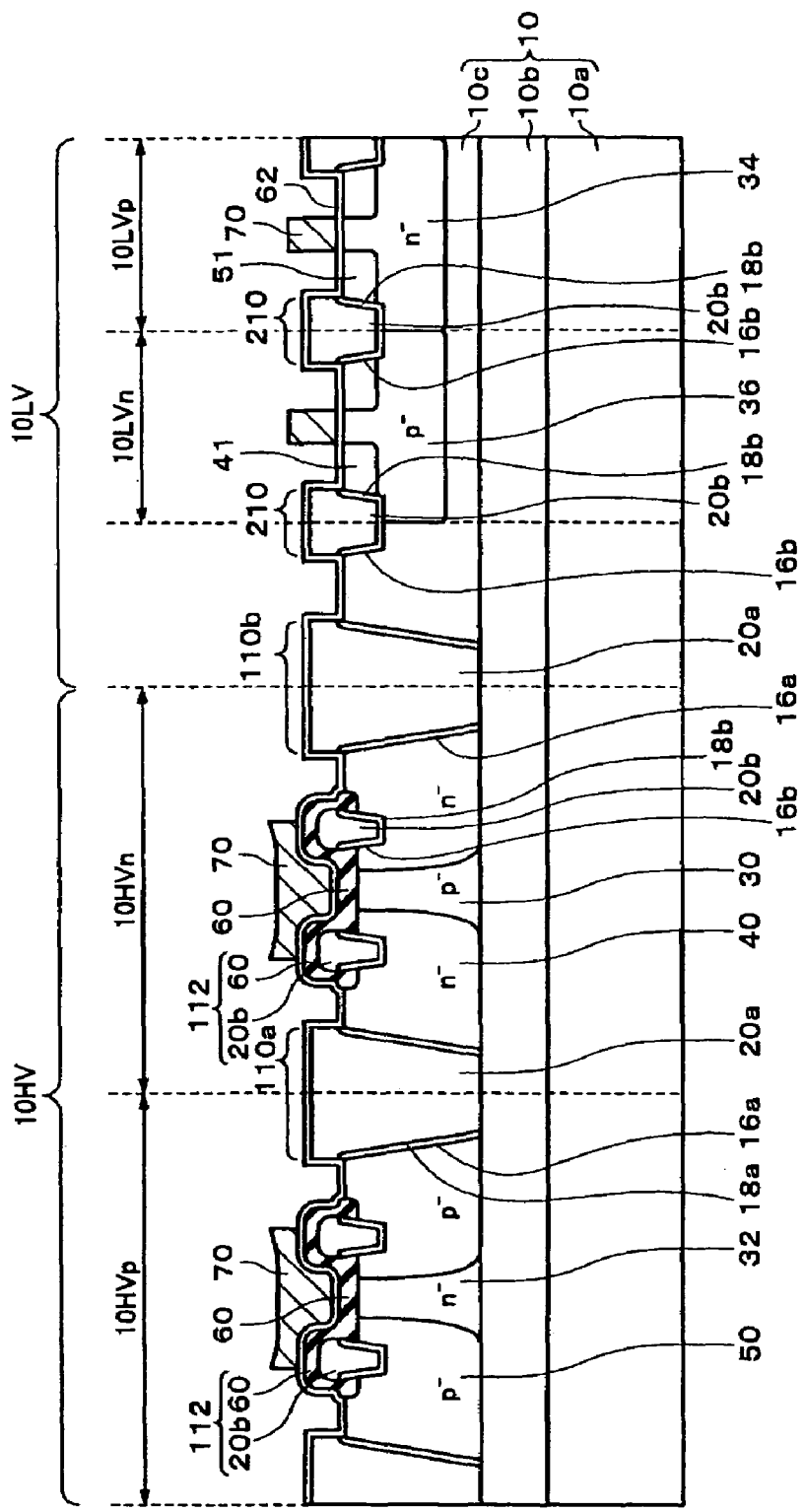
FIG. 20 is a cross-sectional view showing a step in the first method of manufacturing a semiconductor device.

(19) Next, a resist layer (not shown) is formed with a predetermined pattern. By patterning the polysilicon layer with the resist layer as a mask, the gate electrodes 70 are formed, as shown in FIG. 20.

Next, low concentration dopant layers 41, 51 for the transistors 200P, N are formed in the low breakdown voltage transistor region 10LV. The low concentration dopant layers 41, 51 can be formed by forming mask layers using a standard lithography technique and introducing predetermined dopants.

(20) Next, an insulating layer (not shown) is formed on the entire surface and by anisotropically etching this insulating layer, the sidewall insulating layers 72 (see FIG. 1) are formed on the side surfaces of the gate electrodes 70. Next, by introducing a P-type dopant into a predetermined region of the P-channel high breakdown voltage transistor region 10HVp and the P channel low breakdown voltage transistor region 10LVp, the source/drain regions 52 are formed outside the sidewall insulating layer 72 as shown in FIG. 1. The formation of the P-type high concentration dopant layers 52 that are the source/drain regions can be performed according to a known method.

Next, by introducing an N-type dopant into predetermined regions of the N-channel high breakdown voltage transistor region 10HVn and the N channel low breakdown voltage transistor region 10LVn, the source/drain regions 42 are formed. The formation of the N-type high concentration dopant layers 42 that are the source/drain regions can be performed according to a known method.

As described above, the semiconductor device shown in FIG. 1 is formed.

(A) According to the method of manufacturing according to the present embodiment, the high breakdown voltage transistors 100P, N can be formed in regions isolated by the first and third isolation regions 110a, b that reach the insulating layer 10b. This means that a wide isolation region that was conventionally required to achieve the breakdown voltage is no longer necessary. The occurrence of parasitic MOS transistors that are sometimes formed in the lower part of the isolation region can also be inhibited. Additionally, since there is no need to provide a high concentration dispersed layer as a guard ring, the area of the high breakdown voltage transistor region 10HV can be reduced.

(B) The low breakdown voltage transistors 200P, N can be formed in regions that are isolated by second isolation regions 210 with a depth that does not reach the insulating layer 10b. This means that the characteristic effects of an SOI substrate, such as the substrate floating effect, can be eradicated. In addition, it is possible to apply conventional design resources in the low breakdown voltage transistor region 10LV.

Next, a second method of manufacturing a semiconductor device will be described with reference to FIGS. 21 to 24. This second embodiment is an example where the method of forming the first and third isolation regions 110a, b and the second isolation regions 210 differ from the first method of manufacturing a semiconductor device. FIGS. 21 to 24 are cross-sectional views schematically showing steps in the second method of manufacturing a semiconductor device. It should be noted that steps that can be performed in the same way as the first method of manufacturing a semiconductor device are shown using the same drawings and detailed description of such is omitted.

(1) First, as shown in FIG. 2, a first insulating layer 12a is formed on the semiconductor layer 10c. Next, a stopper insulating layer 14a is formed on the first insulating layer 12a. The first insulating layer 12a and the stopper insulating layer 14a can be formed in the same way as in the first embodiment.

Figure 21:
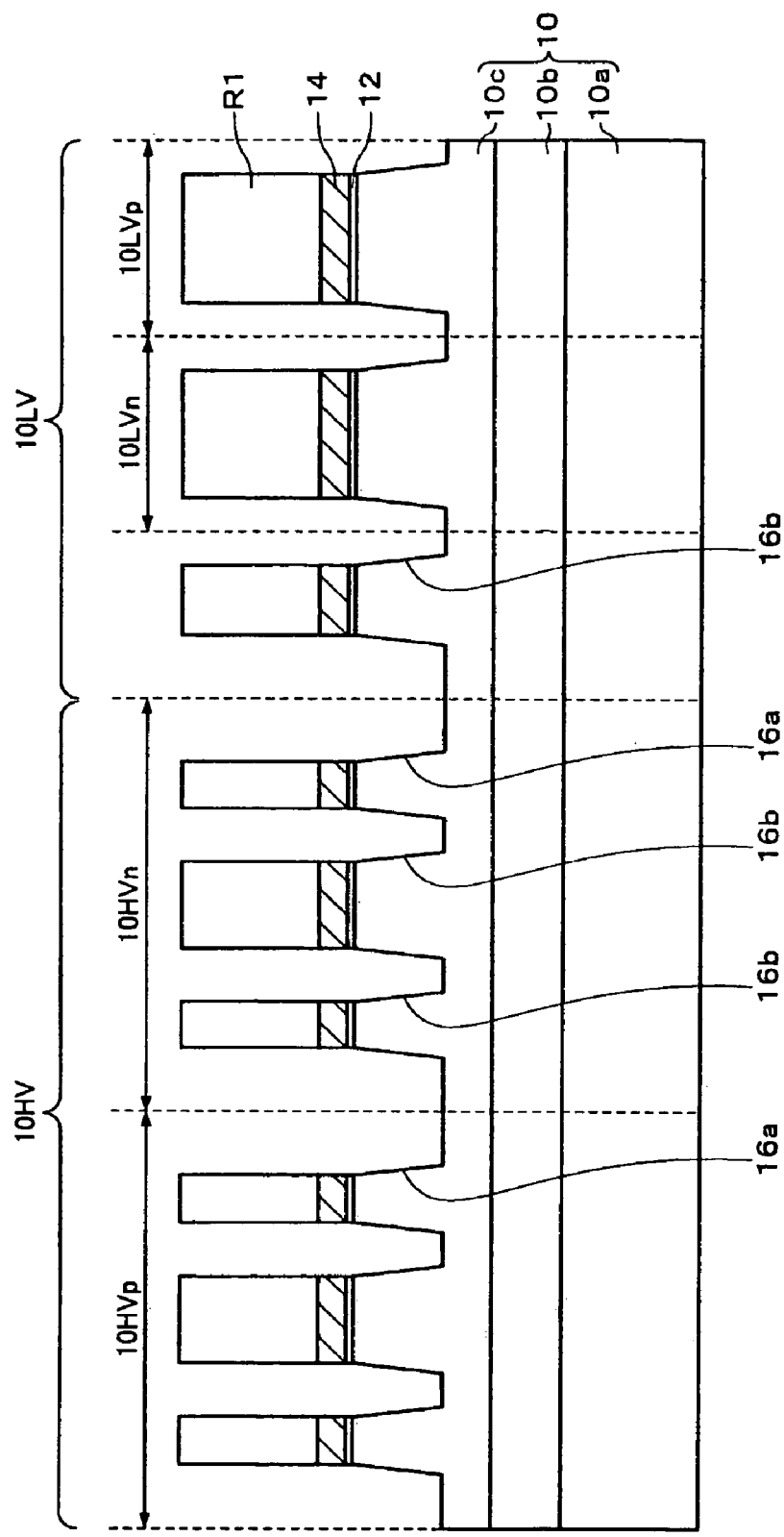
FIG. 21 is a cross-sectional view showing a step in a second method of manufacturing a semiconductor device.

(2) Next, the resist layer R1 with a pattern shown in FIG. 21 is formed on the stopper insulating layer 14a. The resist layer R1 has openings in regions in which the first and third isolation regions 110a, b, the second isolation regions 210, and the second gate insulating layer 112 of the high breakdown voltage transistor region 10HV are formed. Next, the first insulating layer 12a is etched using the resist layer R1 as a mask. After this, the semiconductor layer 10c is etched with the resist layer R1, the stopper insulating layer 14a, and the first insulating layer 12a as a mask. By doing so, trenches 16a for the first and third isolation regions 110a, b and trenches 16b for the second isolation regions 210 and the second gate insulating layer 112 are formed. Etching is performed so that the depth of the trenches 16a, b is around 300 to 1800 nm. Also, in this step, the first insulating layer 12a and the stopper insulating layer 14a are patterned and the pad layer 12 and the stopper layer 14 are formed.

Figure 22:
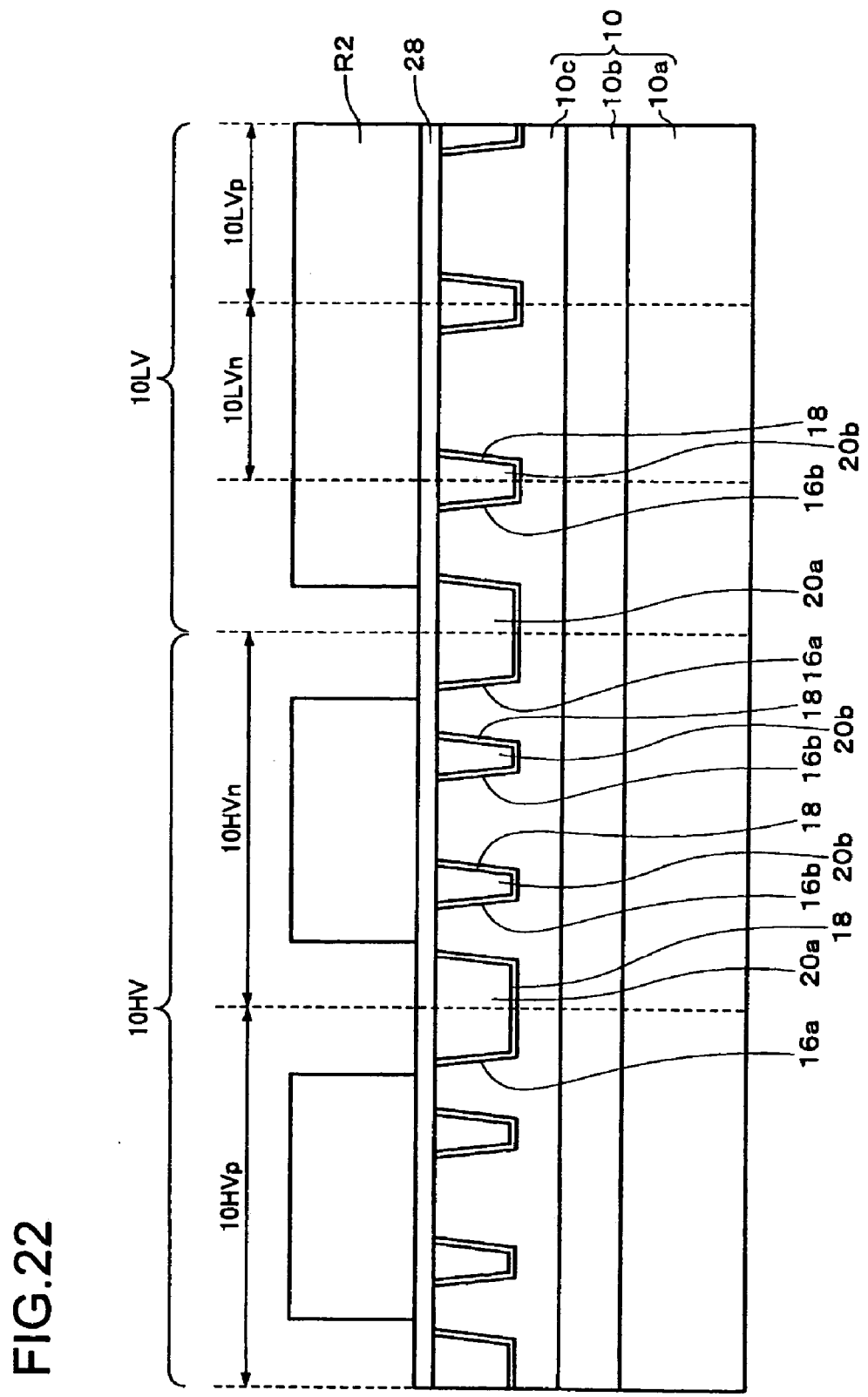
FIG. 22 is a cross-sectional view showing a step in the second method of manufacturing a semiconductor device.

(3) Next, as shown in FIG. 22, the trench insulating layers 20a, b are formed so as to bury the trenches 16a, b. The trench insulating layers 20a, b can be formed by the same method as steps (6) to (8) in the first embodiment, for example.

Next, a silicon nitride layer 28 is formed on the semiconductor layer 10c on which the trench insulating layers 20a, b are formed. After this, a resist layer R2 with openings above the first and third isolation regions 110a, b, that is, above the trenches 16a, is formed on the silicon nitride layer 28.

Figure 23:
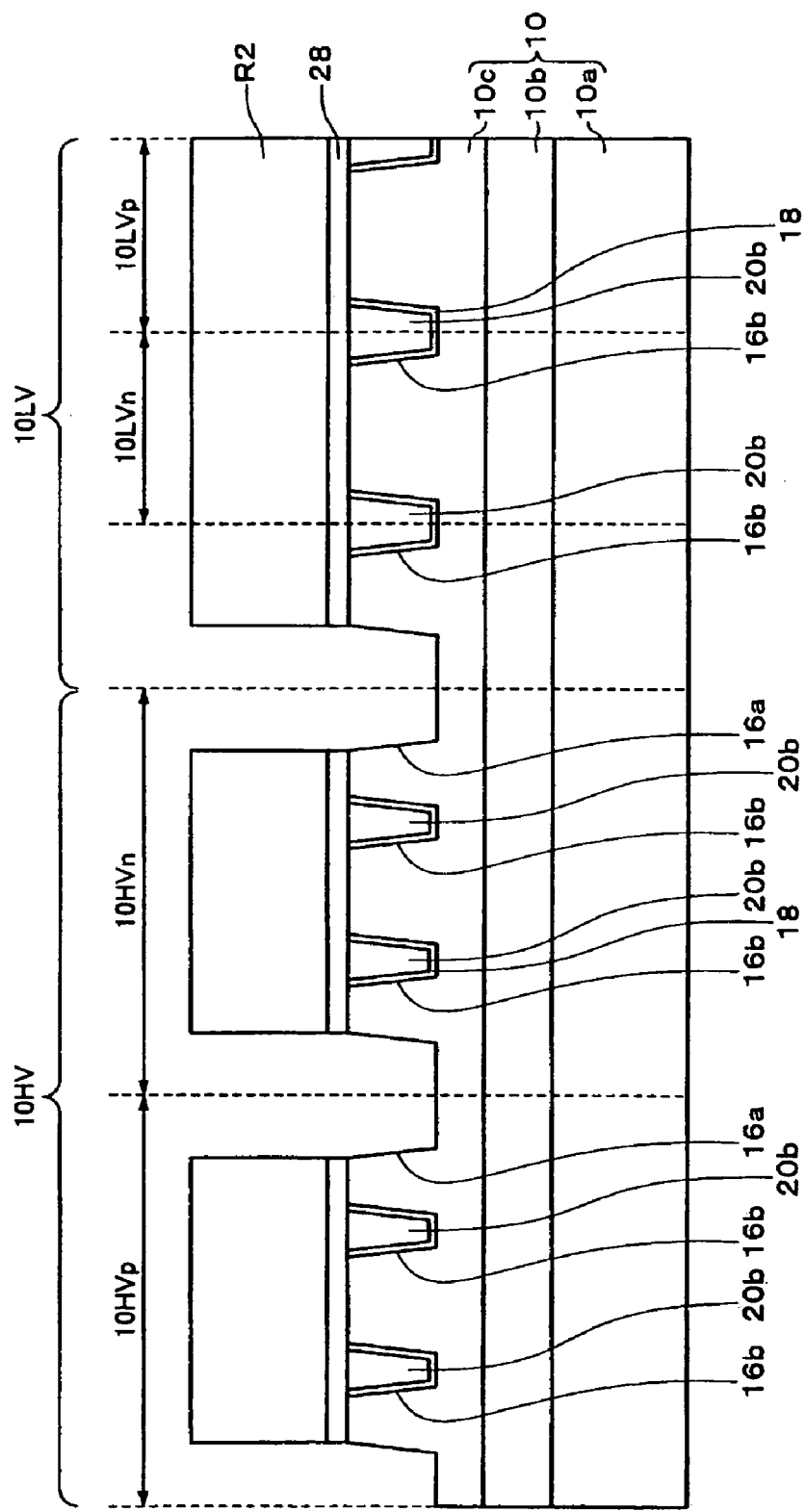
FIG. 23 is a cross-sectional view showing a step in the second method of manufacturing a semiconductor device.

(4) Next, as shown in FIG. 23, the silicon nitride layer 28 is removed with the resist layer R2 as a mask. That is, the silicon nitride layer 28 in the first and third isolation regions 10a, b is removed. In addition the trench insulating layer 20a of the trench 16a is also removed. After this, the resist layer R2 is removed by ashing.

Figure 24:
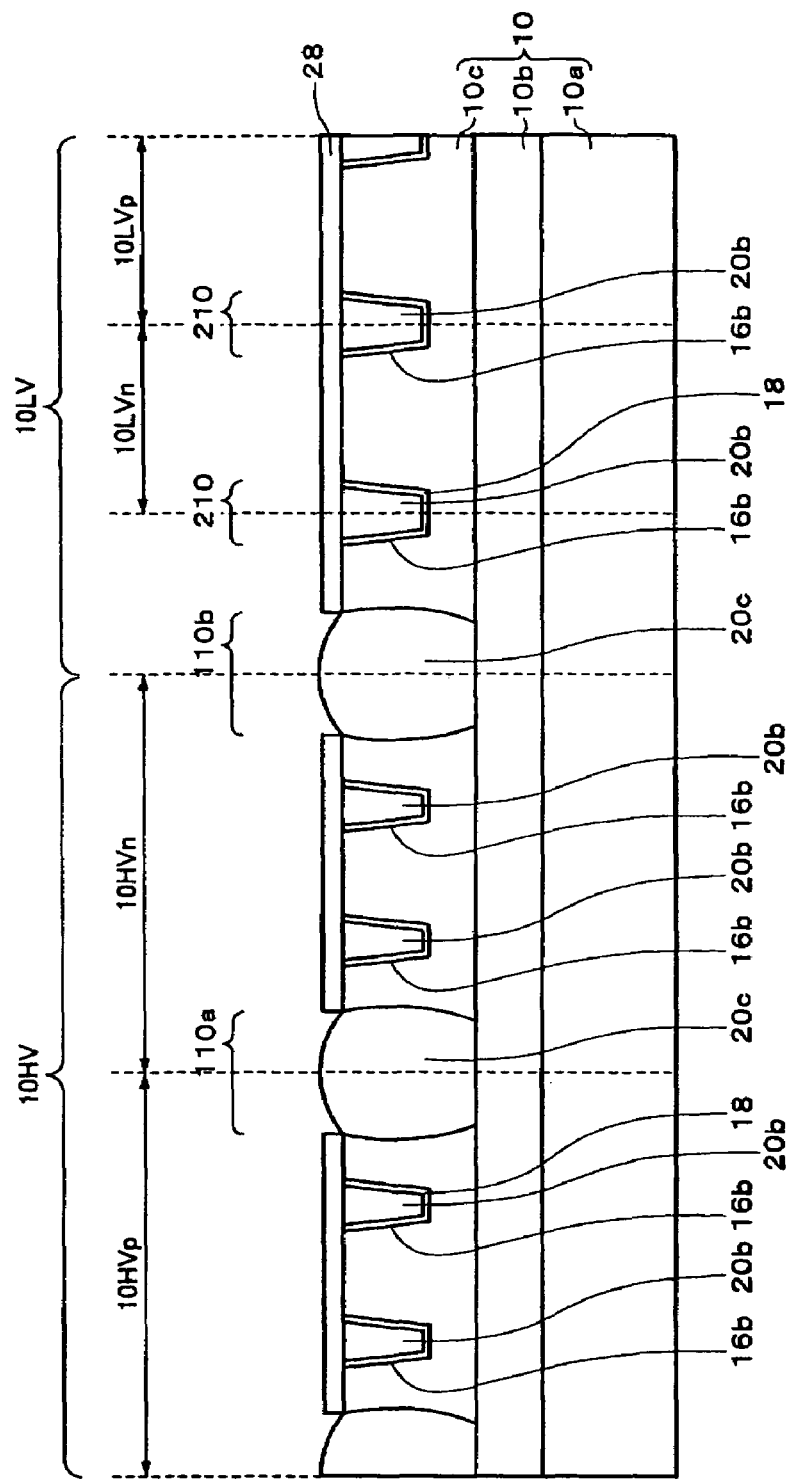
FIG. 24 is a cross-sectional view showing a step in the second method of manufacturing a semiconductor device.

(5) Next, as shown in FIG. 24, thermal oxidation is performed with the silicon nitride layer 28 as a mask. By doing so, the semiconductor layer 10c is oxidized at the first and third isolation regions 110a, b to form oxide films 20c. By doing so, the first and third isolation regions 110a, b are formed with a depth that reaches the insulating layer 10b.

(6) Next, the semiconductor device of the present embodiment can be formed by performing the steps (9) to (20) of the first embodiment.

According to the method of manufacturing a semiconductor device according to the second embodiment, the first and third isolation regions 10a, b can be made up of oxide films formed by thermal oxidation. This means that trenches with a depth that reaches the insulating layer 10b are formed, and compared to the method where insulating layers are buried in these trenches, the amount of stress placed upon the semiconductor layer 10c can be reduced. As a result, favorable first and third isolation regions 110a, b can be formed.

Figure 25:
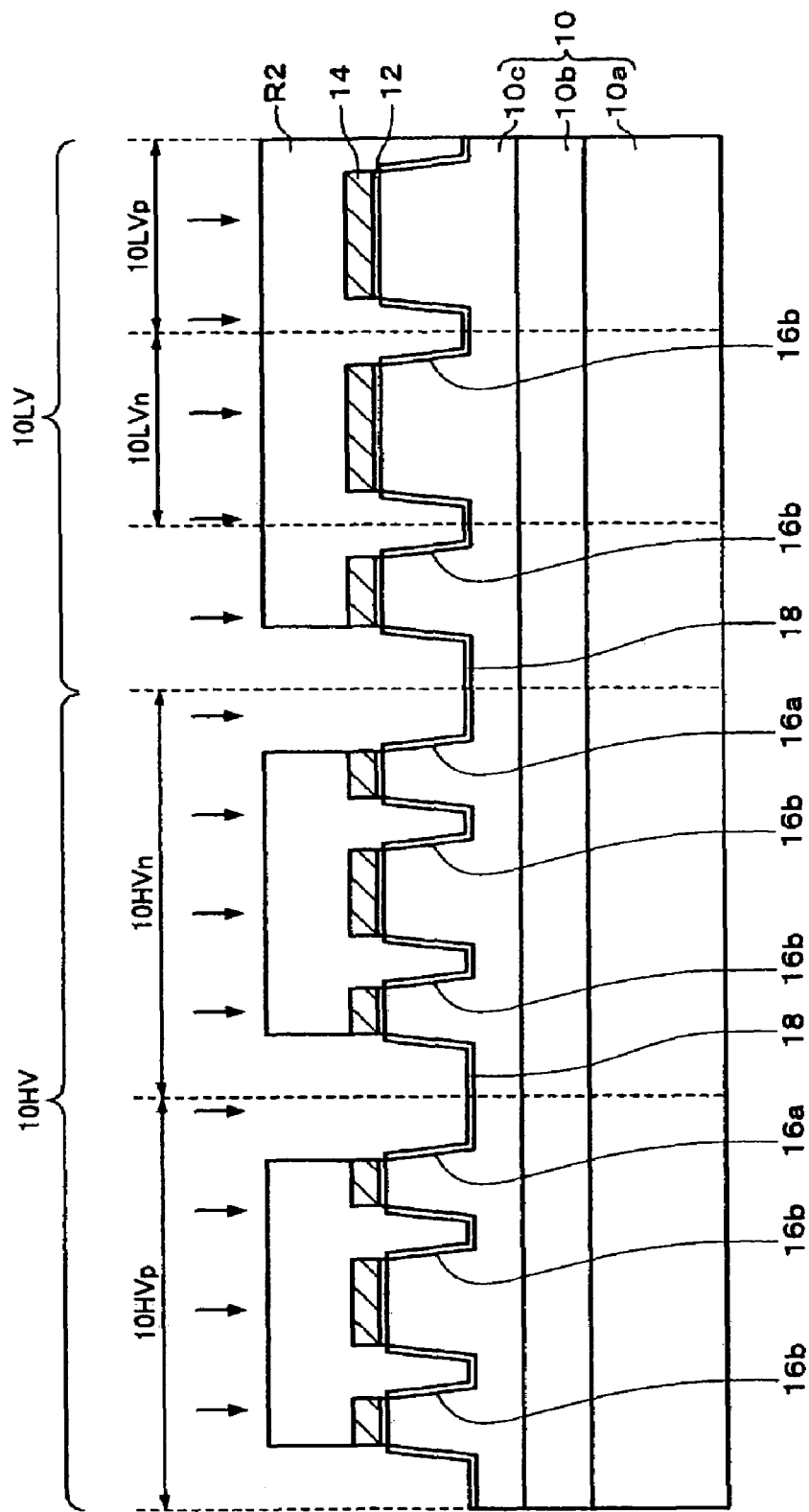
FIG. 25 is a cross-sectional view showing a step in a third method of manufacturing a semiconductor device.
Figure 26:
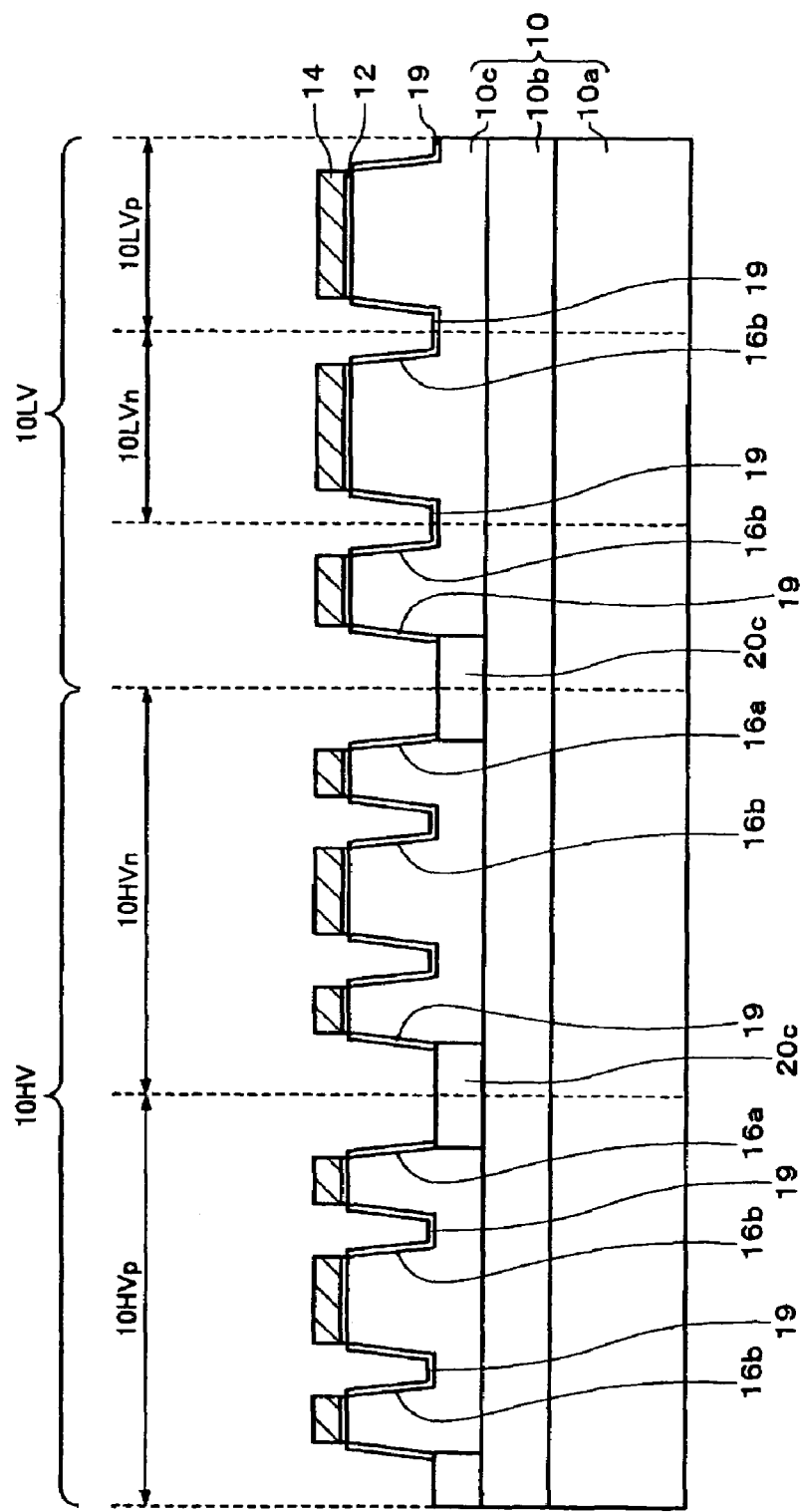
FIG. 26 is a cross-sectional view showing a step in the third method of manufacturing a semiconductor device.

Next, a third method of manufacturing a semiconductor device will be described with reference to FIGS. 25, 26. This third embodiment is an example where the method of forming the first and third isolation regions 110a, b and the second isolation regions 210 differ to the method of manufacturing the first semiconductor device. FIGS. 25, 26 are cross-sectional views schematically showing steps in the third method of manufacturing a semiconductor device. It should be noted that steps that can be performed in the same way as the first and second methods of manufacturing a semiconductor device are shown using the same drawings and detailed description of such is omitted.

(1) First, as shown in FIG. 2, a first insulating layer 12a is formed on the semiconductor layer 10c. Next, a stopper insulating layer 14a is formed on the first insulating layer 12a. The first insulating layer 12a and the stopper insulating layer 14a can be formed in the same way as in the first embodiment.

(2) Next, as shown in FIG. 21, a resist R1 with a predetermined pattern is formed on the stopper insulating layer 14a. The resist layer R1 has openings in regions in which the first and third isolation regions 110a, b, the second isolation regions 210, and the offset layer 112 of the high breakdown voltage transistor region 10HV are formed. Next, the semiconductor layer 10c is etched using the resist layer R1, the stopper insulating layer 14a, and the first insulating layer 12a as a mask, to form the trenches 16a, b. Etching is performed so that the depth of the trenches 16a, b is around 300 to 1800 nm. Also, in this step, the first insulating layer 12a and the stopper insulating layer 14a are patterned and the pad layer 12 and the stopper layer 14 are formed.

(3) Next, as shown in FIG. 25, a first trench oxide film 18 is formed on the surfaces of the trenches 16a, b. The first trench oxide film 18 can be formed in the same way as step (3) in the first embodiment. Next, a resist layer R2 with openings above the trenches 16a is formed. Dopant ions are introduced into the semiconductor layer 10c in a base part of the trenches 16a, with the resist layer R2 as a mask. Here, it is possible to introduce chlorine, for example, as the dopant ions. By doing so, defects are caused in the semiconductor layer 10c. This means that in the later step that forms a thermal oxide film, it is possible to raise the formation speed of thermal oxide films in the semiconductor layer 10c in the base parts of the trenches 16a. After this, the resist layer R2 is removed by ashing. Next, the first trench oxide film 18 formed on the surfaces of the trenches 16a, 16b is removed.

(4) Next, as shown in FIG. 26, a second trench oxide film 19 is formed on the surfaces of the trenches 16a, b. The second trench oxide film 19 can be formed by a method such as thermal oxidation. Due to this thermal oxidation step, the semiconductor layer 10c at the base parts of the trenches 16a is thermally oxidized to become the oxide films 20c. That is, parts of the first and third isolation regions 110a, b, whose depth reaches the insulating layer 10b, are formed.

Next, trench insulating layers 20a, b are formed in the trenches 16a, b. These trench insulating layers 20a, b can be formed in the same way as in steps (6), (7) of the first embodiment. After this, the stopper layer 14 is removed, the first and third isolation regions 110a, b are formed in the high breakdown voltage transistor region 10HV, and the second isolation regions 210 are formed in the low breakdown voltage transistor region 10LV.

(5) Next, the semiconductor device shown in FIG. 1 can be formed by performing the steps (9) to (20) of the method of manufacturing the first semiconductor device.

According to the method of manufacturing a third semiconductor device, the trenches 16a, b can be formed simultaneously, so that the number of steps can be reduced. Also, by introducing dopant into the base parts of the trenches 16a, the formation speed of the thermal oxide films can be increased. As a result, at the same time as the second trench oxide film 19 is formed, oxide films which are thicker than the second trench oxide film 19 and reach the insulating layer 10b are formed in the base parts of the trenches 16a.

Figure 27:
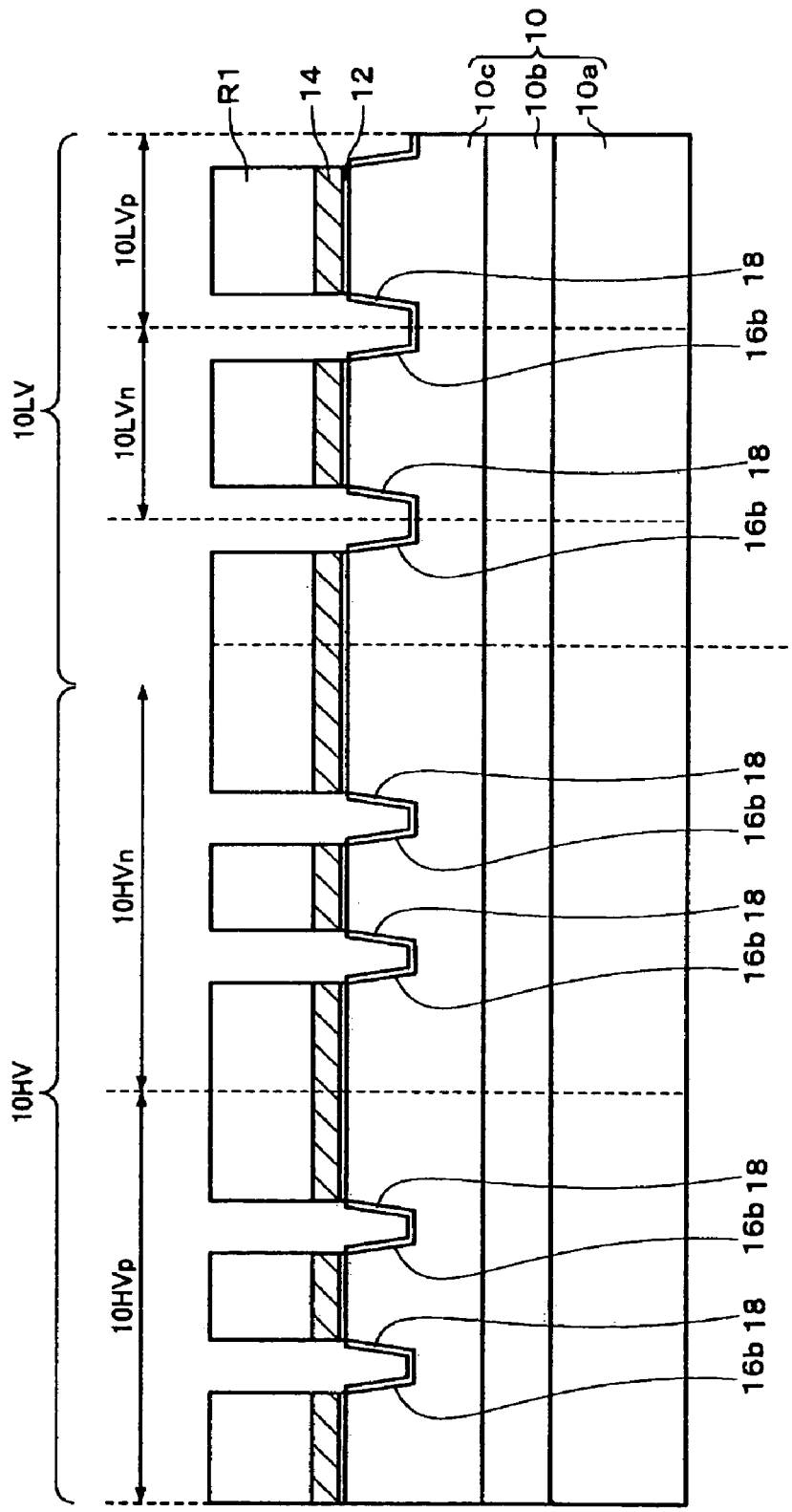
FIG. 27 is a cross-sectional view showing a step in a fourth method of manufacturing a semiconductor device.
Figure 28:
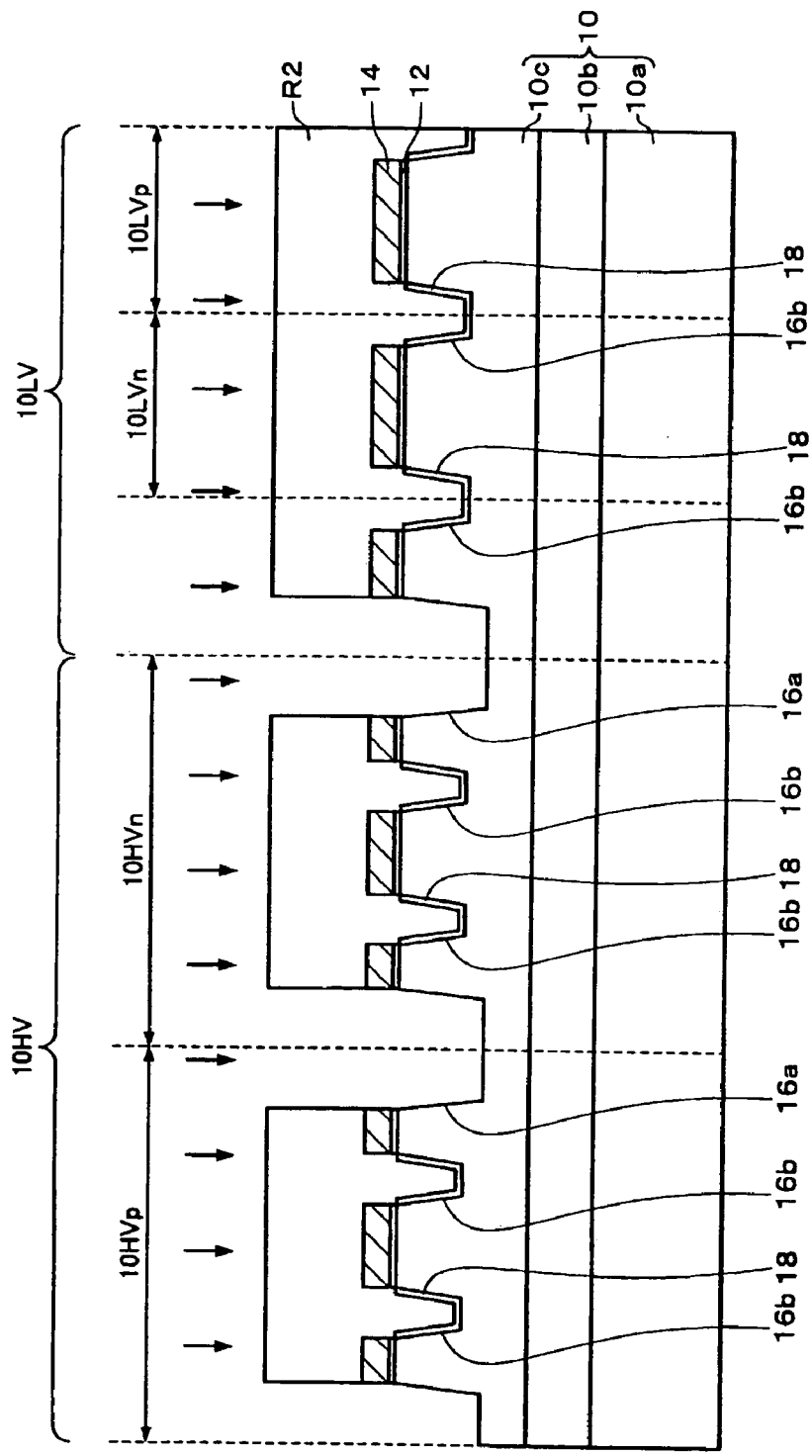
FIG. 28 is a cross-sectional view showing a step in the fourth method of manufacturing a semiconductor device.
Figure 29:
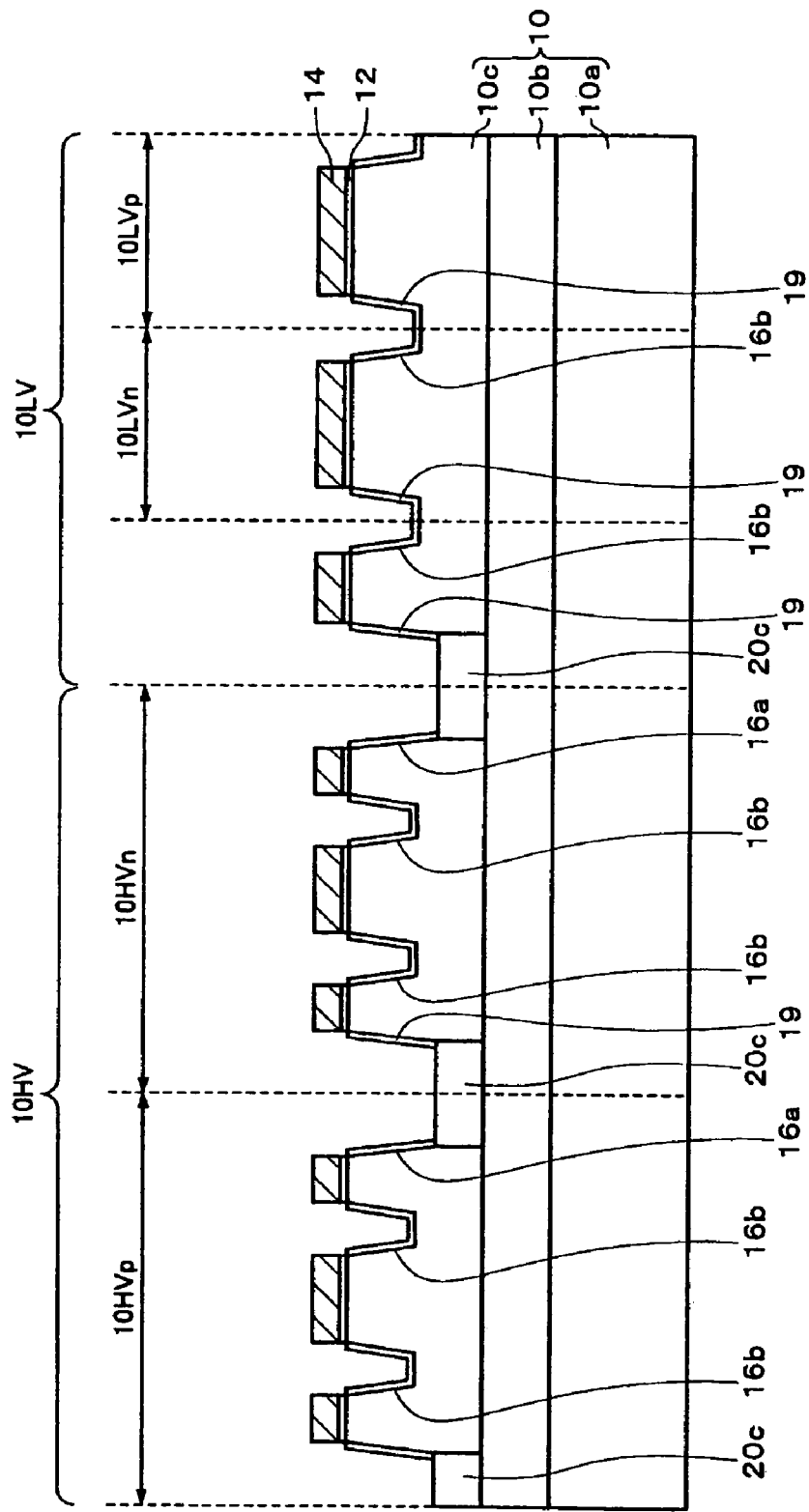
FIG. 29 is a cross-sectional view showing a step in the fourth method of manufacturing a semiconductor device.

Next, a fourth method of manufacturing a semiconductor device will be described with reference to FIGS. 27 to 29. This fourth embodiment is an example where the method of forming the first and third isolation regions 110a, b and the second isolation regions 210 differ to the first method of manufacturing a semiconductor device. FIGS. 27 to 29 are cross-sectional views schematically showing steps in a fourth method of manufacturing a semiconductor device. It should be noted that steps that can be performed in the same way as the first method of manufacturing a semiconductor device are shown using the same drawings and detailed description of such is omitted.

(1) First, as shown in FIG. 2, a first insulating layer 12a is formed on the semiconductor layer 10c. Next, a stopper insulating layer 14a is formed on the first insulating layer 12a. The first insulating layer 12a and the stopper insulating layer 14a can be formed in the same way as in the first embodiment.

(2) Next, as shown in FIG. 27, a resist layer R1 with openings above the second isolation regions 210 of the low breakdown voltage transistor region 10LV, and above the second gate insulating layer 112 of the high breakdown voltage transistor region 10HV is formed on the stopper insulating layer 14a. Next, the stopper insulating layer 14a and the first insulating layer 12a are etched with the resist layer R1 as a mask. After this, the trenches 16b are etched with the resist layer R1, the stopper insulating layer 14a, and the first insulating layer 12a as a mask. Etching is performed so that the depth of the trenches 16b is around 400 nm. After this, the resist layer R1 is removed by ashing. Next, the trench oxide films 18 are formed on the surfaces of the trenches 16b. The trench oxide films 18 are formed by thermal oxidation, for example.

(3) Next, as shown in FIG. 28, the resist layer R2 with a predetermined pattern is formed. The resist layer R2 has openings above the first and third isolation regions 110a, b of the high breakdown voltage transistor region 10HV. Next, the stopper insulating layer 14a and the first insulating layer 12a are etched with the resist layer R2 as a mask. After this, the semiconductor layer 10c is etched with the resist layer R2, the stopper insulating layer 14a, and the first insulating layer 12a as a mask to form the trenches 16a. Etching is performed until the depth of the trenches 16a is such that an insulating film 20c, which is formed at the same time as a subsequent formation of oxide films, that is, the trench oxide films 19, definitely reaches the semiconductor layer 10c.

Next, dopant ions are introduced into the base parts of the trenches 16a. By doing so, defects are caused in the single crystal silicon layer that constructs the semiconductor layer 10c. After this, the resist layer R2 is removed by ashing. Next, the trench oxide films 18 formed on the surfaces of the trenches 16b are removed.

(4) Next, as shown in FIG. 29, trench oxide films 19 are formed on the surfaces of the trenches 16a, b. The trench oxide films 19 can be formed by thermal oxidation, for example. The thickness of the trench oxide films 19 is around 50 to 100 nm, but thicker films may be formed. As a result of this step, the semiconductor layer 10c that is in the base parts of the trenches 16a is thermally oxidized to become the oxide films 20c. By doing so, part of the first and third isolation regions 110a, b that reach the insulating layer 10b can be formed.

Next, the trench insulating layers 20a, b are formed in the trenches 16a, b. The trench insulating layers 20a, b can be formed in the same way as the (6), (7) of the first embodiment. After this, the stopper layer 14 is removed, the first and third isolation regions 110a, b are formed in the high breakdown voltage transistor region 10HV, and the second isolation regions 210 are formed in the low breakdown voltage transistor region 10LV.

(6) Next, the semiconductor device shown in FIG. 1 can be formed by performing the steps (9) to (20) of the first method of manufacturing a semiconductor device.

According to the fourth method of manufacturing a semiconductor device, in the first and third isolation regions 110a, b, the formation of the trenches 16a can be combined with the formation of the oxide films 20c. This means that the difference in depths between the trenches 16a and the trenches 16b can be reduced, and the trench insulating layers 20a, b can be favorably buried.

Also, by introducing dopant into the base parts of the trenches 16a it is possible to increase the formation speed of the thermal oxide layer. This means that the semiconductor layer 10c at the base parts of the trenches 16a can be formed of a thicker oxide layer than regions of the semiconductor layer in which dopant is not introduced, and the first and third isolation regions 110a, b can be formed with a depth that reaches the insulating layer 10b.

It should be noted that the present invention is not limited to the above embodiments, and that modifications may be made within the range covered by the gist of the invention.

For example, in the first method of manufacturing a semiconductor device, it is possible to form the trench insulating layers 20a, b as follows. First, as shown in FIG. 6, the trenches 16a, b are formed. After this, an insulating layer is formed as thickly as possible to bury only the trenches 16b. This insulating layer can be formed according to HDP or CVD. An SOG film is then formed so as to bury parts of the trenches 16a that are not filled with the insulating layer. Next, the trench insulating layers 20a, b can be formed by removing the SOG film by CMP until the stopper layer 14 is exposed.

Also, the second method of manufacturing a semiconductor device can be modified as follows. First, the trenches 16a are formed for the first and third isolation regions 110a, b. At this point, the trenches 16a are positioned deeper than the trenches 16b for the second isolation regions 210 and are formed so as to not reach the insulating layer 10b. Next, an oxide film can be formed on the surfaces of the trenches 16a by thermal oxidation, and the first and third isolation regions 110a, b can be formed with a depth that reaches the insulating layer 10b. After this, the second isolation regions 210 and the offset layer 112 are formed. In this state, by appropriately controlling the ratio of the width of the trenches 16a to the thickness of the semiconductor layer 10c at the base parts of the trenches 16a, it is possible to further relieve stress. For example, the ratio of the width of a trench 16a to the thickness of the semiconductor layer 10c at the base part of the trench 16a should preferably be 2:1.

Although embodiments of the present invention have been described, the present invention is not limited to these embodiments and modifications are possible within the range covered by the gist of the invention. For example, offset insulating layers that are parts of the second isolation regions 210 and the second gate insulating layer 112 were described as being formed in the above embodiments by a method where elements are isolated by trenches, but can also be formed using LOCOS isolation or semi-recessed LOCOS isolation.

What is claimed is:

1. A semiconductor device, comprising:
   a support substrate;
   an insulating layer formed on the support substrate;
   a first semiconductor layer formed on the insulating layer;
   a first high breakdown voltage transistor formed in the first semiconductor layer, the first high breakdown voltage transistor having a source and a drain;
   a second semiconductor layer formed on the insulating layer;

a second high breakdown voltage transistor formed in the second semiconductor layer, the second high breakdown voltage transistor having a source and a drain;

a first isolation region formed through the first semiconductor layer and the second semiconductor layer, the first isolation region: being between the first and second high breakdown voltage transistors; contacting the source and the drain of each high breakdown voltage transistor; completely surrounding each of the first and second high breakdown voltage transistors individually; and having a depth that reaches the insulating layer;

a third semiconductor layer formed on the insulating layer;

a first low breakdown voltage transistor formed in the third semiconductor layer;

a second low breakdown voltage transistor formed in the third semiconductor layer; and a second isolation region formed in the third semiconductor layer between the first low breakdown voltage transistor and the second first low breakdown voltage transistor, the second isolation region having a depth that does not reach the insulating layer.

2. A semiconductor device according to claim 1, further comprising:
a third isolation region formed between the second semiconductor layer and the third semiconductor layer, the third isolation region having a depth that reaches the insulating layer.

3. A semiconductor device according to claim 1,
wherein the first semiconductor layer, the second semiconductor layer, and the third semiconductor layer are all of equal thickness.

4. A semiconductor device according to claim 2,
wherein the first semiconductor layer, the second semiconductor layer, and the third semiconductor layer are all of equal thickness.

5. A semiconductor device according to claim 3,
wherein the first semiconductor layer, the second semiconductor layer, and the third semiconductor layer are respectively 500 to 2,000 nm thick.

6. A semiconductor device according to claim 4,
wherein the first semiconductor layer, the second semiconductor layer, and the third semiconductor layer are respectively 500 to 2,000 nm thick.

7. A semiconductor device according to claim 1,
wherein surfaces of the first semiconductor layer, the second semiconductor layer, and the third semiconductor layer are at a same level.

8. A semiconductor device according to claim 2,
wherein surfaces of the first semiconductor layer, the second semiconductor layer, and the third semiconductor layer are at a same level.

9. A semiconductor device according to claim 1,
wherein the first and second high breakdown voltage transistors further comprise:
a first gate insulating layer formed above a channel region; and
a second gate insulating layer formed above an offset region,
wherein the second gate insulating layer is thicker than the first gate insulating layer.

10. A semiconductor device according to claim 2,
wherein the first and second high breakdown voltage transistors further comprise:
a first gate insulating layer formed above a channel region; and
a second gate insulating layer formed above an offset region,
wherein the second gate insulating layer is thicker than the first gate insulating layer.

11. A semiconductor device according to claim 1,
wherein the first semiconductor layer defines at least one trench that has a base part reaching the insulating layer and sidewalls extending through the first semiconductor layer; and
further comprising a trench oxide film on the sidewalls of the at least one trench layer, wherein the trench oxide film has a lower end adjacent the insulating layer and an upper end that is rounded to favorably bury the at least one trench.

12. A semiconductor device comprising:
a support substrate having a high breakdown voltage transistor region with a first isolation region and a second isolation region, wherein the first and second isolation regions are sized and configured to include one transistor per region;
an insulating layer formed on the support substrate;
a first high breakdown voltage transistor in the first isolation region;
a second high breakdown voltage transistor in the second isolation region; and
a low breakdown voltage transistor, wherein the first and second high breakdown voltage transistors are completely surrounded by the respective isolation region, wherein the first and second isolation regions have a depth that reaches the insulating layer such that the first and second isolation regions isolates the first and second high breakdown voltage transistors from other transistors, and the low breakdown voltage transistor is adjacent to a shallow isolation region having a depth that does not reach the insulating layer.

* * * * *